United States Patent
Brooks et al.

(10) Patent No.: US 10,534,606 B2
(45) Date of Patent: Jan. 14, 2020

(54) RUN-LENGTH ENCODING DECOMPRESSION

(71) Applicant: Oracle International Corporation, Redwood Shores, CA (US)

(72) Inventors: Jeffrey S. Brooks, Austin, TX (US); Robert Golla, Austin, TX (US); Albert Danysh, Redwood Shores, CA (US); Shasank Chavan, Menlo Park, CA (US); Prateek Agrawal, Santa Clara, CA (US); Andrew Ewoldt, Santa Clara, CA (US); David Weaver, Redwood Shores, CA (US)

(73) Assignee: ORACLE INTERNATIONAL CORPORATION, Redwood Shores, CA (US)

(*) Notice: Subject to any disclaimer, the term of this patent is extended or adjusted under 35 U.S.C. 154(b) by 132 days.

(21) Appl. No.: 14/867,929

(22) Filed: Sep. 28, 2015

(65) Prior Publication Data
US 2016/0019064 A1    Jan. 21, 2016

Related U.S. Application Data

(63) Continuation-in-part of application No. 14/023,064, filed on Sep. 10, 2013, now Pat. No. 9,792,117, which
(Continued)

(51) Int. Cl.
*H03M 7/46* (2006.01)
*H03M 7/30* (2006.01)
(Continued)

(52) U.S. Cl.
CPC ...... *G06F 9/30003* (2013.01); *G06F 9/30018* (2013.01); *G06F 16/221* (2019.01);
(Continued)

(58) Field of Classification Search
CPC . G06T 9/005; G06F 9/30003; G06F 9/30018; G06F 9/30036; G06F 9/30032;
(Continued)

(56) References Cited

U.S. PATENT DOCUMENTS 4,626,829 A * 12/1986 Hauck .................... G06T 9/005
                                                    341/106
5,109,226 A *  4/1992 MacLean, Jr. .......... H03M 7/42
                                                    341/107
(Continued)

FOREIGN PATENT DOCUMENTS

EP     1 111 500 A1    3/1996
EP     2040180 A1     3/2009
(Continued)

OTHER PUBLICATIONS

Frank O'Brien, "The Apollo Guidance Computer—Architecture and Operation", 2010, Springer, (pp. 27-28, 54, 76, and 141).*
(Continued)

*Primary Examiner* — Aimee Li
*Assistant Examiner* — Andrew J Cromer
(74) *Attorney, Agent, or Firm* — Hickman Palermo Becker Bingham LLP

(57) ABSTRACT

Approaches are described to improve database performance by implementing a RLE decompression function at a low level within a general-purpose processor or an external block. Specifically, embodiments of a hardware implementation of an instruction for RLE decompression are disclosed. The described approaches improve performance by supporting the RLE decompression function within a processor and/or external block. Specifically, a RLE decompression hardware implementation is disclosed that produces a 64-bit RLE decompression result, with an example embodiment performing the task in two pipelined execution
(Continued)

stages with a throughput of one per cycle. According to embodiments, hardware organization of narrow-width shifters operating in parallel, controlled by computed shift counts, is used to perform the decompression. Because of the decreased time required to perform RLE decompression according to embodiments, the performance of tasks that use embodiments described herein for decompression of run-length encoded data is made more efficient.

23 Claims, 13 Drawing Sheets

Related U.S. Application Data is a continuation-in-part of application No. 13/708,054, filed on Dec. 7, 2012, now Pat. No. 8,572,131.

(60) Provisional application No. 62/138,891, filed on Mar. 26, 2015, provisional application No. 61/801,207, filed on Mar. 15, 2013, provisional application No. 61/709,142, filed on Oct. 2, 2012, provisional application No. 61/568,644, filed on Dec. 8, 2011.

(51) Int. Cl.
  *G06F 9/30* (2018.01)
  *G06F 16/22* (2019.01)

(52) U.S. Cl.
  CPC ........... *G06F 9/30036* (2013.01); *H03M 7/30* (2013.01); *H03M 7/46* (2013.01)

(58) Field of Classification Search
  CPC ............... G06F 9/30156; G06F 9/3016; G06F 2207/382; G06F 2212/40; H03M 7/46; H03M 7/30
  See application file for complete search history.

(56) References Cited

U.S. PATENT DOCUMENTS

| | | | |
|---|---|---|---|
| RE34,052 E | 9/1992 | Hester et al. | |
| 5,175,810 A | 12/1992 | Young et al. | |
| 5,287,193 A * | 2/1994 | Lin | G06T 9/005 382/234 |
| 5,423,010 A | 6/1995 | Mizukami | |
| 5,511,190 A | 4/1996 | Sharma et al. | |
| 5,581,705 A | 12/1996 | Passint et al. | |
| 5,592,622 A | 1/1997 | Isfeld | |
| 5,617,567 A | 4/1997 | Doktor | |
| 5,655,080 A | 8/1997 | Dias et al. | |
| 5,675,382 A * | 10/1997 | Bauchspies | H03M 7/42 358/1.9 |
| 5,696,959 A | 12/1997 | Guttag | |
| 5,706,495 A | 1/1998 | Chadha Atul et al. | |
| 5,826,259 A | 10/1998 | Doktor | |
| 5,884,229 A | 3/1999 | Matteucci | |
| 5,884,299 A | 3/1999 | Ramesh | |
| 5,887,183 A | 3/1999 | Agarwal | |
| 5,933,650 A | 8/1999 | Van Hook | |
| 5,996,708 A | 12/1999 | Gerold | |
| 6,047,081 A | 4/2000 | Groezinger et al. | |
| 6,118,724 A | 9/2000 | Higginbottom | |
| 6,161,173 A * | 12/2000 | Krishna | G06F 9/3836 712/214 |
| 6,178,405 B1 * | 1/2001 | Ouyang | H03M 7/48 704/500 |
| 6,219,457 B1 * | 4/2001 | Potu | G06T 9/005 341/67 |
| 6,317,824 B1 | 11/2001 | Thakkar et al. | |
| 6,331,826 B1 * | 12/2001 | Wagner | G06T 9/005 341/51 |
| 6,336,180 B1 | 1/2002 | Long | |
| 6,339,616 B1 * | 1/2002 | Kovalev | H04N 19/51 348/699 |
| 6,381,601 B1 | 4/2002 | Fujiwara et al. | |
| 6,416,410 B1 * | 7/2002 | Abou-Samra | G06T 9/005 345/614 |
| 6,496,915 B1 | 12/2002 | Halleck | |
| 6,604,155 B1 | 8/2003 | Chong et al. | |
| 6,671,797 B1 | 12/2003 | Golston | |
| 6,745,174 B2 | 6/2004 | Levy et al. | |
| 6,779,105 B1 * | 8/2004 | Bouyoux | G06F 9/3867 712/219 |
| 6,829,697 B1 | 12/2004 | Davis et al. | |
| 6,842,848 B2 | 1/2005 | Hokenek et al. | |
| 6,996,569 B1 | 2/2006 | Bedell et al. | |
| 7,020,661 B1 | 3/2006 | Cruanes | |
| 7,047,252 B2 | 5/2006 | Buch et al. | |
| 7,490,221 B2 | 2/2009 | Evans | |
| 7,617,346 B2 | 11/2009 | Wang et al. | |
| 7,725,595 B1 | 5/2010 | Geissler et al. | |
| 7,769,726 B2 | 8/2010 | Faerber et al. | |
| 7,809,713 B2 | 10/2010 | Su et al. | |
| 7,861,060 B1 | 12/2010 | Nickolls et al. | |
| 7,877,373 B2 | 1/2011 | Zait | |
| 7,991,794 B2 | 8/2011 | Bedi et al. | |
| 8,049,760 B2 | 11/2011 | Jiao et al. | |
| 8,126,855 B2 | 2/2012 | Faerber et al. | |
| 8,244,780 B1 | 8/2012 | Narayanan | |
| 8,260,803 B2 | 9/2012 | Hsu et al. | |
| 8,285,709 B2 | 10/2012 | Candea et al. | |
| 8,326,810 B2 | 12/2012 | Faerber et al. | |
| 8,375,145 B2 | 2/2013 | Kagan et al. | |
| 8,521,788 B2 | 8/2013 | Ellison et al. | |
| 8,533,216 B2 | 9/2013 | Buger et al. | |
| 8,543,534 B2 | 9/2013 | Alves et al. | |
| 8,572,131 B2 | 10/2013 | Ellison et al. | |
| 8,589,613 B2 | 11/2013 | Griggs | |
| 8,667,252 B2 | 3/2014 | Colavin et al. | |
| 8,725,707 B2 | 5/2014 | Chen et al. | |
| 8,826,522 B2 | 9/2014 | Roblot | |
| 8,938,644 B2 | 1/2015 | Clark et al. | |
| 8,996,463 B2 | 3/2015 | Merriman et al. | |
| 9,432,298 B1 | 8/2016 | Smith | |
| 9,658,675 B1 | 5/2017 | Witek | |
| 9,977,664 B2 | 5/2018 | Toyama | |
| 2001/0037345 A1 | 11/2001 | Kiernan et al. | |
| 2002/0032678 A1 | 3/2002 | Cornwell et al. | |
| 2002/0033762 A1 * | 3/2002 | Belu | H03M 7/30 341/87 |
| 2002/0091826 A1 | 7/2002 | Comeau | |
| 2002/0091905 A1 * | 7/2002 | Geiger | H03M 7/30 711/170 |
| 2002/0095562 A1 | 7/2002 | Nakanishi | |
| 2002/0154154 A1 | 10/2002 | Cornelius | |
| 2002/0165896 A1 | 11/2002 | Kim | |
| 2002/0184392 A1 | 12/2002 | Parthasarathy et al. | |
| 2002/0188830 A1 | 12/2002 | Boles et al. | |
| 2003/0135495 A1 * | 7/2003 | Vagnozzi | G06F 16/2237 |
| 2003/0167460 A1 | 9/2003 | Desai | |
| 2003/0182464 A1 | 9/2003 | Hamilton | |
| 2003/0187858 A1 | 10/2003 | Kirk et al. | |
| 2004/0030863 A1 | 2/2004 | Paver | |
| 2004/0068642 A1 | 4/2004 | Tanaka | |
| 2004/0160446 A1 | 8/2004 | Gosalia | |
| 2005/0055384 A1 | 3/2005 | Ganesh | |
| 2005/0071322 A1 | 3/2005 | Chen | |
| 2005/0091256 A1 | 4/2005 | Rathakrishnan et al. | |
| 2005/0177706 A1 | 8/2005 | Lee | |
| 2006/0116989 A1 | 6/2006 | Bellamkonda et al. | |
| 2006/0179255 A1 | 8/2006 | Yamazaki | |
| 2006/0218194 A1 | 9/2006 | Yalamanchi | |
| 2007/0061600 A1 | 3/2007 | Kuroda | |
| 2007/0074214 A1 | 3/2007 | Ueno | |
| 2007/0203925 A1 | 8/2007 | Sandler et al. | |
| 2007/0260579 A1 | 11/2007 | Bae | |
| 2008/0046686 A1 | 2/2008 | Cameron | |
| 2008/0086480 A1 | 4/2008 | Srivastava | |
| 2008/0086495 A1 | 4/2008 | Kizitunc | |
| 2008/0134213 A1 | 6/2008 | Alverson | |
| 2008/0294863 A1 | 11/2008 | Faerber et al. | |

(56) References Cited

U.S. PATENT DOCUMENTS

| | | |
|---|---|---|
| 2009/0028192 A1 | 1/2009 | Rieger |
| 2009/0037700 A1 | 2/2009 | Graham |
| 2009/0055350 A1 | 2/2009 | Branish et al. |
| 2009/0094193 A1 | 4/2009 | King et al. |
| 2009/0235047 A1 | 9/2009 | Hachmann |
| 2009/0287628 A1 | 11/2009 | Indeck |
| 2009/0287637 A1 | 11/2009 | Day et al. |
| 2009/0313210 A1 | 12/2009 | Bestgen et al. |
| 2010/0020880 A1 | 1/2010 | Susnow |
| 2010/0030728 A1 | 2/2010 | Chakkappen et al. |
| 2010/0030796 A1 | 2/2010 | Netz et al. |
| 2010/0082705 A1 | 4/2010 | Bhashyam et al. |
| 2010/0088309 A1 | 4/2010 | Petcelescu et al. |
| 2010/0106944 A1 | 4/2010 | Symes |
| 2010/0115295 A1 | 5/2010 | Diab |
| 2010/0161646 A1 | 6/2010 | Ceballos et al. |
| 2010/0257391 A1 | 10/2010 | Dring |
| 2010/0278446 A1 | 11/2010 | Ganesh et al. |
| 2010/0281004 A1 | 11/2010 | Kapoor |
| 2010/0281013 A1 | 11/2010 | Graefe |
| 2010/0299316 A1 | 11/2010 | Faerber et al. |
| 2011/0029557 A1 | 2/2011 | Raghavan et al. |
| 2011/0119249 A1 | 5/2011 | Flatz |
| 2011/0228325 A1* | 9/2011 | Shiraishi ............ G06K 15/1898 358/1.15 |
| 2011/0302151 A1 | 12/2011 | Abadi |
| 2012/0005509 A1 | 1/2012 | Araki |
| 2012/0014265 A1 | 1/2012 | Schlansker |
| 2012/0054225 A1 | 3/2012 | Marwah et al. |
| 2012/0071152 A1 | 3/2012 | Roundtree |
| 2012/0159448 A1 | 6/2012 | Arcese |
| 2012/0166447 A1 | 6/2012 | Nice |
| 2012/0197868 A1 | 8/2012 | Fauser |
| 2012/0209873 A1 | 8/2012 | He |
| 2012/0234908 A1 | 9/2012 | Wang |
| 2012/0310916 A1 | 12/2012 | Abadi |
| 2013/0151458 A1 | 6/2013 | Indeck |
| 2013/0151567 A1 | 6/2013 | Ellison et al. |
| 2013/0151568 A1 | 6/2013 | Ellison et al. |
| 2013/0275364 A1 | 10/2013 | Wang |
| 2013/0275473 A1 | 10/2013 | Ellison et al. |
| 2013/0303663 A1 | 11/2013 | Agnely et al. |
| 2014/0013076 A1* | 1/2014 | Ganesh ............... G06F 9/30036 712/4 |
| 2014/0013077 A1 | 1/2014 | Ganesh et al. |
| 2014/0013078 A1 | 1/2014 | Ganesh et al. |
| 2014/0052713 A1 | 2/2014 | Schauer et al. |
| 2014/0052726 A1 | 2/2014 | Amberg et al. |
| 2014/0074818 A1 | 3/2014 | Barber |
| 2014/0095748 A1 | 4/2014 | Aingaran et al. |
| 2014/0096145 A1 | 4/2014 | Aingaran et al. |
| 2014/0208138 A1 | 7/2014 | Homchaudhuri |
| 2014/0208331 A1 | 7/2014 | Li |
| 2014/0214796 A1 | 7/2014 | Barber |
| 2014/0279838 A1 | 9/2014 | Tsirogiannis |
| 2014/0281354 A1 | 9/2014 | Tkacik |
| 2014/0304490 A1 | 10/2014 | Toyama |
| 2015/0046411 A1 | 2/2015 | Kazmaier |
| 2015/0074384 A1 | 3/2015 | Yajima |
| 2015/0120698 A1 | 4/2015 | Plattner |
| 2015/0181273 A1 | 6/2015 | Shaool |
| 2015/0227585 A1 | 8/2015 | Braham |
| 2015/0261535 A1 | 9/2015 | Snyder, II |
| 2016/0246811 A1 | 8/2016 | Ackerman |
| 2016/0253379 A1 | 9/2016 | Ford |
| 2016/0285623 A1 | 9/2016 | Yoon |
| 2016/0350347 A1 | 12/2016 | Das et al. |
| 2017/0024435 A1 | 1/2017 | Kociubes et al. |
| 2017/0039238 A1 | 2/2017 | Elias |
| 2017/0060587 A1 | 3/2017 | Chavan |
| 2017/0085378 A1 | 3/2017 | Shields |
| 2017/0185527 A1 | 6/2017 | Ueda |
| 2017/0270052 A1 | 9/2017 | Brown et al. |
| 2017/0322725 A1 | 11/2017 | Klingenberg |
| 2018/0004581 A1 | 1/2018 | Brown |
| 2018/0067889 A1 | 3/2018 | Brown |
| 2018/0101530 A1 | 4/2018 | Brown |
| 2018/0107627 A1 | 4/2018 | LeBeane et al. |
| 2018/0144005 A1 | 5/2018 | Chavan |
| 2018/0144006 A1 | 5/2018 | Chavan |
| 2018/0232417 A1 | 8/2018 | Das |

FOREIGN PATENT DOCUMENTS

| | | |
|---|---|---|
| EP | 2423843 A1 | 2/2012 |
| GB | 2338095 A | 12/1999 |
| JP | 2000261674 A | 9/2000 |
| WO | WO 00/08552 A1 | 2/2000 |
| WO | WO2010/039895 | 4/2010 |
| WO | WO 2013/095653 A1 | 6/2013 |
| WO | WO 2013/095662 A1 | 6/2013 |

OTHER PUBLICATIONS

Ganesh, U.S. Appl. No. 14/023,249, filed Sep. 10, 2013, Notice of Allowance, dated Feb. 27, 2017.

Chavan, U.S. Appl. No. 14/338,219, filed Jul. 22, 2014, Restriction Requirement, dated Jan. 13, 2017.

Ganesh, U.S. Appl. No. 14/023,064, filed Sep. 10, 2013, Notice of Allowance, dated Jun. 16, 2017.

Chavan, U.S. Appl. No. 14/3385,219, filed Jul. 22, 2014, Office Action, dated Jun. 2, 2017.

Zukowski, M. "Vectorwise: Beyond Column Stores" ACTIAN 2012, 17 pages.

Wikipedia, "SIMD", Single Instruction Multiple Instruction, dated Jan. 1, 2013, 7 pages.

Wikipedia, "In Memory Database", Dated Jan. 30, 2013, 4 pages.

Weinhardt, Markus, "Compilation and Pipeline Synthesis for Reconfigurable Architectures", 1997, 8 pages.

W. Cockshott et al., "High-Performance Operations Using a Compressed Database Architecture", The Computer Journal, vol. 41, 1998, 14 pages.

Silva et al., "Using a Tighly-Coupled Pipeline in Dynamically Reconfigureable Platform FPGAs", dated May 2003, 4 pages.

Schmit et al., "PipeRench: A Virtualized Programmable Data path in 0.18 Micron Technology", dated 2002, 4 pages.

Park et al., "Polymorphic Pipeline Array: A Flexible Multicore Accelerator with Virtualized Execution for Mobile Multimedia Applications", Dated Dec. 12, 2009 11 pages.

IBM Technical Disclosure Bulletin, "Data Packing and Upacking Scheme for High Performance Image Processing", vol. No. 7, dated Jul. 1993, 6 pages.

Dynamic Scheduling Techniques, http://www.cs.iastate.edu/~prabhu/Tutorial/PIPELINE/dynamSchedTech.html, printed on Jul. 4, 2012, 2 pages.

CCCP: Accelerator Virtualization, http://cccp.eecs.umich.edu/research/virtual.php, printed on Jul. 4, 2012, 3 pages.

Brewer et al., "Remote Queues: Exposing Message Queues for Optimization and Atomicity", dated Jul. 17, 1995, ACM, 12 pages.

"MonetDB", Wikipedia, available: http://en.wikipedia.org/wiki/MonetDB, May 16, 2012, 3 pages.

"Column Store features" monetdb, available: http://www.moneydb.org/Home/Features, 2008-2013, 3 pages.

U.S. Appl. No. 13/590,110, filed Aug. 20, 2012, Office Action, dated Jul. 1, 2014.

U.S. Appl. No. 13/590,057, filed Aug. 20, 2012, Advisory Action, dated Feb. 26, 2015.

U.S. Appl. No. 13/590,057, filed Aug. 20, 2012, Final Office Action, dated Oct. 19, 2015.

U.S. Appl. No. 13/590,057, filed Aug. 20, 2012, Final Office Action, dated Nov. 18, 2014.

U.S. Appl. No. 13/590,057, filed Aug. 20, 2012, Notice of Allowance, dated Sep. 30, 2016.

U.S. Appl. No. 13/590,057, filed Aug. 20, 2012, Office Action, dated Apr. 22, 2015.

U.S. Appl. No. 13/590,057, filed Aug. 20, 2012, Office Action, dated Jul. 1, 2014.

(56) References Cited

OTHER PUBLICATIONS

U.S. Appl. No. 13/590,0547, filed Aug. 20, 2012, Advisory Action, dated Feb. 11, 2016.
U.S. Appl. No. 13/590,110, filed Aug. 20, 2012, Office Action, dated Apr. 14, 2016.
U.S. Appl. No. 13/590,057, filed Aug. 20, 2012, Advisory Action, dated Feb. 11, 2016.
U.S. Appl. No. 13/590,110, filed Aug. 20, 2012, Office Action, dated Oct. 2, 2015.
U.S. Appl. No. 13/590,110, filed Aug. 20, 2012, Office Action, dated Dec. 18, 2013.
U.S. Appl. No. 13/590,110, filed Aug. 20, 2012, Notice of Allowance, dated Aug. 1, 2016.
U.S. Appl. No. 13/708,054, filed Dec. 7, 2012, Ex Parte Quayle, Feb. 14, 2013.
U.S. Appl. No. 13/708,054, filed Dec. 7, 2012, Notice of Allowance, dated Jul. 1, 2013.
U.S. Appl. No. 13/590,057, filed Aug. 20, 2012, Office Action, dated Jan. 7, 2014.
U.S. Appl. No. 13/590,110, filed Aug. 20, 2012, Final Office Action, dated Mar. 27, 2015.
U.S. Appl. No. 14/023,064, filed Sep. 10, 2013, Office Action, dated Mar. 28, 2016.
U.S. Appl. No. 15/362,693, filed Nov. 28, 2016, Notice of Allowance, dated Aug. 7, 2018.
U.S. Appl. No. 14/023,064, filed Sep. 10, 2013, Final Office Action, dated Oct. 6, 2016.
Anonymous:, "Hash Table—Wikipedia, the free encyclopedia", dated Jun. 20, 2012, retrieved from the internet: http://wayback.archive.org/wiki/harshtable, 18 pages.
Coprocessor Wizard, Platform Studio, http://www.xilinx.com/itp/xilinx10/help/platform_studio/ps_c_cpw_coprocessor_wizard.htm, 2008, 2 pages.
Binkert et al., "A Simple Integrated Network Interface for High-Bandwidth Servers", dated Jan. 2006, 22 pages.
Chavan, U.S. Appl. No. 14/338,219, filed Jul. 22, 2014, Notice of Allowance, dated Sep. 25, 2017.
Chavan, U.S. Appl. No. 14/338,219, filed 047/22/2014, Interview Summary, dated Sep. 11, 2017.
Brown, U.S. Appl. No. 15/073,905, filed Mar. 18, 2016, Office Action, dated Sep. 25, 2017.
Schlegel et al., "Fast Integer Compression Using SIMD Instructions", dated 2010, ACM, 7 pages.
Brown, U.S. Appl. No. 15/290,357, filed Oct. 11, 2016, Final Office Action, dated Feb. 15, 2019.
Brown, U.S. Appl. No. 15/290,357, filed Oct. 11, 2016, Advisory Action, dated Mar. 15, 2019.
Brown, U.S. Appl. No. 15/197,436, filed Jun. 29, 2016, Interview Summary, dated Feb. 25, 2019.
Das, U.S. Appl. No. 14/806,614, filed Jul. 22, 2015, Office Action, dated Dec. 6, 2017.
Brown, U.S. Appl. No. 15/197,436, filed Jun. 29, 2016, Office Action, dated Nov. 29, 2017.
Kociubes U.S. Appl. No. 14/806,576, filed Jul. 22, 2015, Interview Summary, dated Feb. 14, 2018.
Das, U.S. Appl. No. 14/806,614, filed Jul. 22, 2015, Interview Summary, dated Jan. 17, 2018.
Brown, U.S. Appl. No. 15/362,688, filed Nov. 28, 2016, Notice of Allowance, dated Apr. 25, 2018.
Brown, U.S. Appl. No. 15/073,905, filed Mar. 18, 2016, Notice of Allowance, dated Apr. 24, 2018.
Kociubes, U.S. Appl. No. 14/806,576, filed Jul. 22, 2015, Notice of Allowance, dated Apr. 11, 2018.
Chavan, U.S. Appl. No. 15/211,418, filed Jul. 15, 2016, Office Action, dated May 4, 2018.
Brown, U.S. Appl. No. 15/197,436, filed Jun. 29, 2016, Office Action, dated Dec. 13, 2018.
Das, U.S. Appl. No. 15/945,733, filed Apr. 4, 2018, Office Action, dated Aug. 9, 2018.
Brown, U.S. Appl. No. 15/290,357, filed Oct. 11, 2016, Office Action, dated Aug. 27, 2018.
Brown, U.S. Appl. No. 15/256,936, filed Sep. 6, 2016, Office Action, dated Sep. 20, 2018.
Brown, U.S. Appl. No. 15/197,436, filed Jun. 29, 2016, Advisory Action, dated Sep. 7, 2018.
Das, U.S. Appl. No. 15/945,733, filed Apr. 4, 2018, Notice of Allowance, dated Nov. 16, 2018.
Chavan, U.S. Appl. No. 15/211,418, filed Jul. 15, 2016, Notice of Allowance, dated Oct. 31, 2018.
Brown, U.S. Appl. No. 15/197,4736, filed Jun. 29, 2016, Office Action, dated Dec. 13, 2018.
Brown, U.S. Appl. No. 15/290,357, filed Oct. 11, 2016, Interview Summary, dated Dec. 4, 2018.
Brown, U.S. Appl. 15/256,936, filed Sep. 6, 2016, Interview Summary, dated Dec. 19, 2018.
Jain, U.S. Appl. No. 15/362,673, filed Nov. 28, 2016, Notice of Allowance, dated Jun. 14, 2019.
Brown, U.S. Appl. No. 15/256,936, filed Sep. 6, 2016, Suplemental Notice of Allowability, dated May 24, 2019.
Jain, U.S. Appl. No. 15/364,149, filed Nov. 29, 2016, Notice of Allowance, dated Mar. 22, 2019.
Jain, U.S. Appl. No. 15/362,673, filed Nov. 28, 2016, Office Action, dated Mar. 28, 2019.

* cited by examiner

FIG. 2

202
RECEIVE AN INSTRUCTION TO DECOMPRESS A RUN-LENGTH-ENCODED (RLE) VALUE; WHEREIN THE RLE VALUE COMPRISES A PLURALITY OF BITS; AND WHEREIN EACH BIT, OF THE RLE VALUE, CORRESPONDS TO A CORRESPONDING RUN LENGTH OF A PLURALITY OF RUN LENGTHS

204
IN RESPONSE TO RECEIVING THE INSTRUCTION TO DECOMPRESS THE RLE VALUE, PERFORM A SET OF ACTIONS THAT ARE INDICATED IN A DEFINITION OF THE INSTRUCTION

206
REPLICATE EACH BIT, OF THE RLE VALUE, A NUMBER OF TIMES INDICATED BY THE CORRESPONDING RUN LENGTH THAT CORRESPONDS TO THE BIT, TO PRODUCE A PLURALITY OF REPLICATED VALUES, EACH OF WHICH CORRESPONDS TO A CORRESPONDING BIT OF THE RLE VALUE

208
CONCATENATE THE REPLICATED VALUES, OF THE PLURALITY OF REPLICATED VALUES, IN THE SAME ORDER AS THE BITS OF THE RLE VALUE TO WHICH THE REPLICATED VALUES CORRESPOND, TO PRODUCE A DECOMPRESSED VALUE

210
STORE THE DECOMPRESSED VALUE AS A RESULT OF THE INSTRUCTION TO DECOMPRESS THE RLE VALUE

FIG. 3

302 — GENERATE A SET OF INTERMEDIATE VALUES, EACH OF WHICH CORRESPONDS TO A CORRESPONDING BIT OF THE RLE VALUE; WHEREIN ALL OF THE INTERMEDIATE VALUES, OF THE SET OF INTERMEDIATE VALUES, HAVE THE SAME NUMBER OF BITS, RESPECTIVELY; AND WHEREIN ALL OF THE BITS OF EACH INTERMEDIATE VALUE, OF THE SET OF INTERMEDIATE VALUES, HAVE THE VALUE OF THE BIT OF THE RLE VALUE THAT CORRESPONDS TO THE INTERMEDIATE VALUE

304 — SHIFT ZERO OR MORE BITS OUT OF ONE OR MORE INTERMEDIATE VALUES, OF THE SET OF INTERMEDIATE VALUES, TO PRODUCE ONE OR MORE ADJUSTED INTERMEDIATE VALUES; WHEREIN THE NUMBER OF BITS SHIFTED OUT OF EACH OF THE ONE OR MORE ADJUSTED INTERMEDIATE VALUES IS BASED, AT LEAST IN PART, ON THE CORRESPONDING RUN LENGTH THAT CORRESPONDS TO THE BIT, OF THE RLE VALUE, THAT CORRESPONDS TO THE INTERMEDIATE VALUE

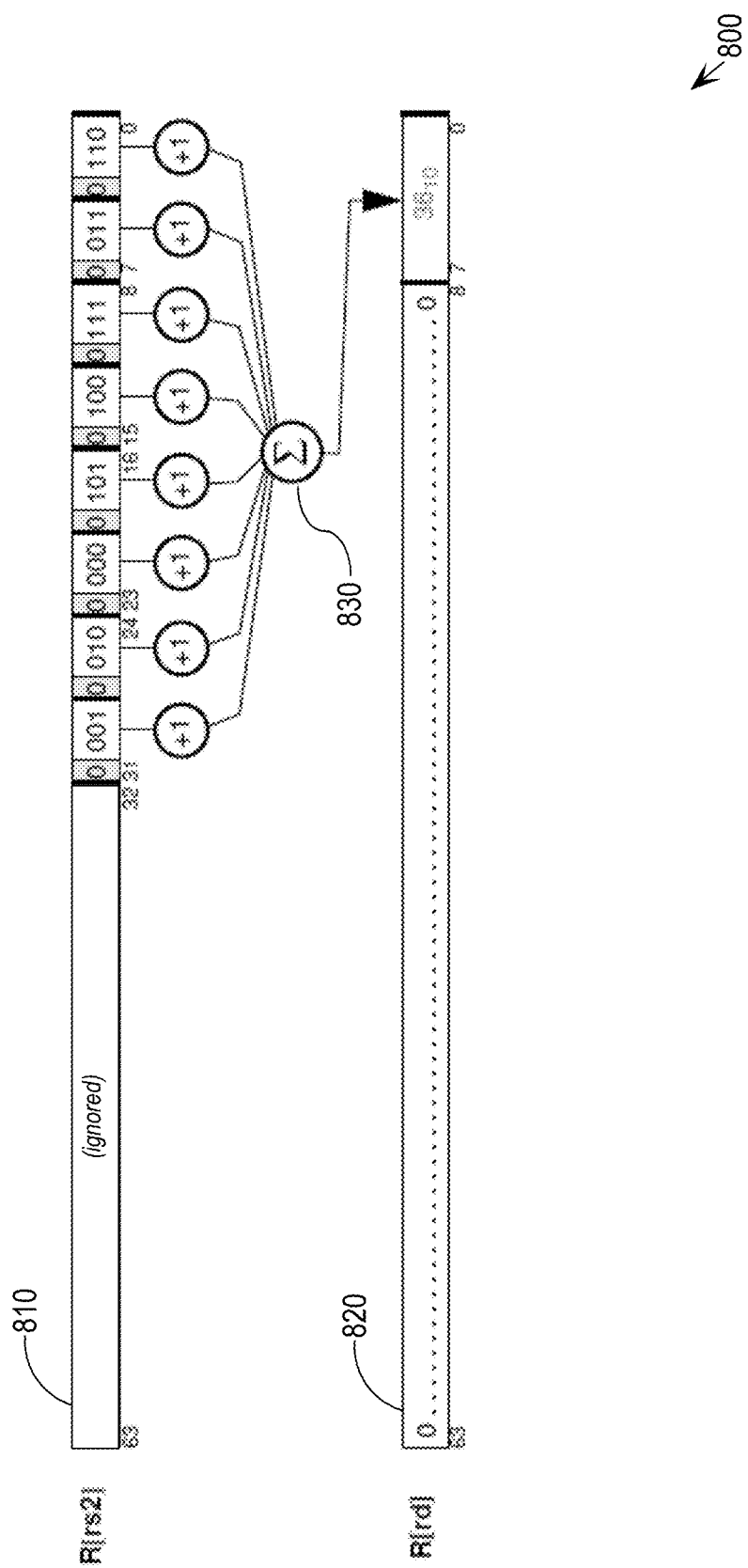

902 RECEIVE A SECOND INSTRUCTION TO DECOMPRESS A SECOND RLE VALUE

904 IN RESPONSE TO RECEIVING THE SECOND INSTRUCTION, PERFORM THE SET OF ACTIONS, BASED ON INFORMATION FOR THE SECOND RLE VALUE, TO PRODUCE A SECOND DECOMPRESSED VALUE

906 RECEIVE ONE OR MORE INSTRUCTIONS TO CONCATENATE THE FIRST AND SECOND DECOMPRESSED VALUES BASED, AT LEAST IN PART, ON THE DETERMINED LENGTH VALUE

908 IN RESPONSE TO RECEIVING THE ONE OR MORE INSTRUCTIONS TO CONCATENATE THE FIRST AND SECOND DECOMPRESSED VALUES BASED, AT LEAST IN PART, ON THE DETERMINED LENGTH VALUE, GENERATE A CONCATENATED VALUE THAT INCLUDES BOTH THE FIRST DECOMPRESSED VALUE AND THE SECOND DECOMPRESSED VALUE WITHOUT INTERVENING UNUSED BITS

RUN-LENGTH ENCODING DECOMPRESSION

CROSS-REFERENCE TO RELATED APPLICATIONS; BENEFIT CLAIM

This application claims the benefit of Provisional Appln. 62/138,891, filed Mar. 26, 2015, the entire contents of which is hereby incorporated by reference as if fully set forth herein, under 35 U.S.C. § 119(e).

This application further claims the benefit, under 35 U.S.C. § 120, as a Continuation-in-part of application Ser. No. 14/023,064, filed Sep. 10, 2013, which in turn claims the benefit, under 35 U.S.C. § 119(e), of (a) Provisional Appln. Ser. No. 61/801,207, filed Mar. 15, 2013, and (b) Provisional Appln. Ser. No. 61/709,142, filed Oct. 2, 2012.

Application Ser. No. 14/023,064 also claims benefit, under 35 U.S.C. § 120, as a Continuation-in-part of application Ser. No. 13/708,054, filed Dec. 7, 2012. Application Ser. No. 13/708,054 in turn claims the benefit, under 35 U.S.C. § 119(e), of (a) Provisional Appln. Ser. No. 61/709,142, filed Oct. 2, 2012, and (b) Provisional Appln. Ser. No. 61/568,644, filed Dec. 8, 2011.

The entire contents of each of the above-referenced documents are hereby incorporated by reference as if fully set forth herein. The applicant(s) hereby rescind any disclaimer of claim scope in the parent application(s) or the prosecution history thereof and advise the USPTO that the claims in this application may be broader than any claim in the parent application(s).

FIELD OF THE INVENTION

The present invention relates to run-length encoding, and more specifically, to a low-level implementation of an instruction for decompressing a run-length-encoded value and for quickly determining a length of the resulting decompressed value.

BACKGROUND

Run-length encoding (RLE) is a way to compress data such that, many times, the compressed data can be represented using less bits than the original (uncompressed) representation of the data. More specifically, to perform RLE on a particular data item, one or more runs of data within the particular data item are identified. A run of data is composed of a particular data value that repeatedly occurs in sequence. For example, the string "aaaabbbbccccc" is a run of four 'a' characters followed by a run of four 'b' characters followed by a run of five 'c' characters. As a further example, the string "123123123123123123123" is a run of seven occurrences of the data value "123". RLE causes a run of data to be represented as the data value that is repeated (e.g., 'a') and the number of repetitions of the value (e.g., four).

Many times, this type of encoding reduces the number of bits required to represent a string of characters that contains one or more data runs. For example, using a shorthand representation of run-length encoding, the string "aaaabbbbccccc" can be represented as the run-length-encoded value 4a4b5c, which may be represented with less bits than the unencoded representation of the string would require. As such, RLE is a useful tool for compressing data.

Generally, the decompressing of RLE-encoded values is performed based on high-level computing instructions (such as instructions written in Java, C++, etc.) which are compiled into low-level instructions and/or machine code that accomplish the tasks requested in the high-level instructions. The compiled low-level instructions are not always optimized for the fastest performance of the requested tasks. This lack of optimization can slow down functions that require decompression of RLE-encoded values. As such, it would be beneficial to optimize decompression of RLE-encoded values at the hardware level.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

In the drawings:

FIG. 2 depicts a flowchart for decompressing an RLE-encoded value using a specialized hardware instruction.

FIG. 3 depicts a flowchart for replicating the bits of an RLE-encoded value based on run lengths that respectively correspond to the bits.

FIG. 8 depicts a set of registers on which an RLE_LENGTH instruction is based.

FIG. 9 depicts a flowchart for compressing out unused bits between a first decompressed value and a second decompressed value.

DETAILED DESCRIPTION

Figure 1:
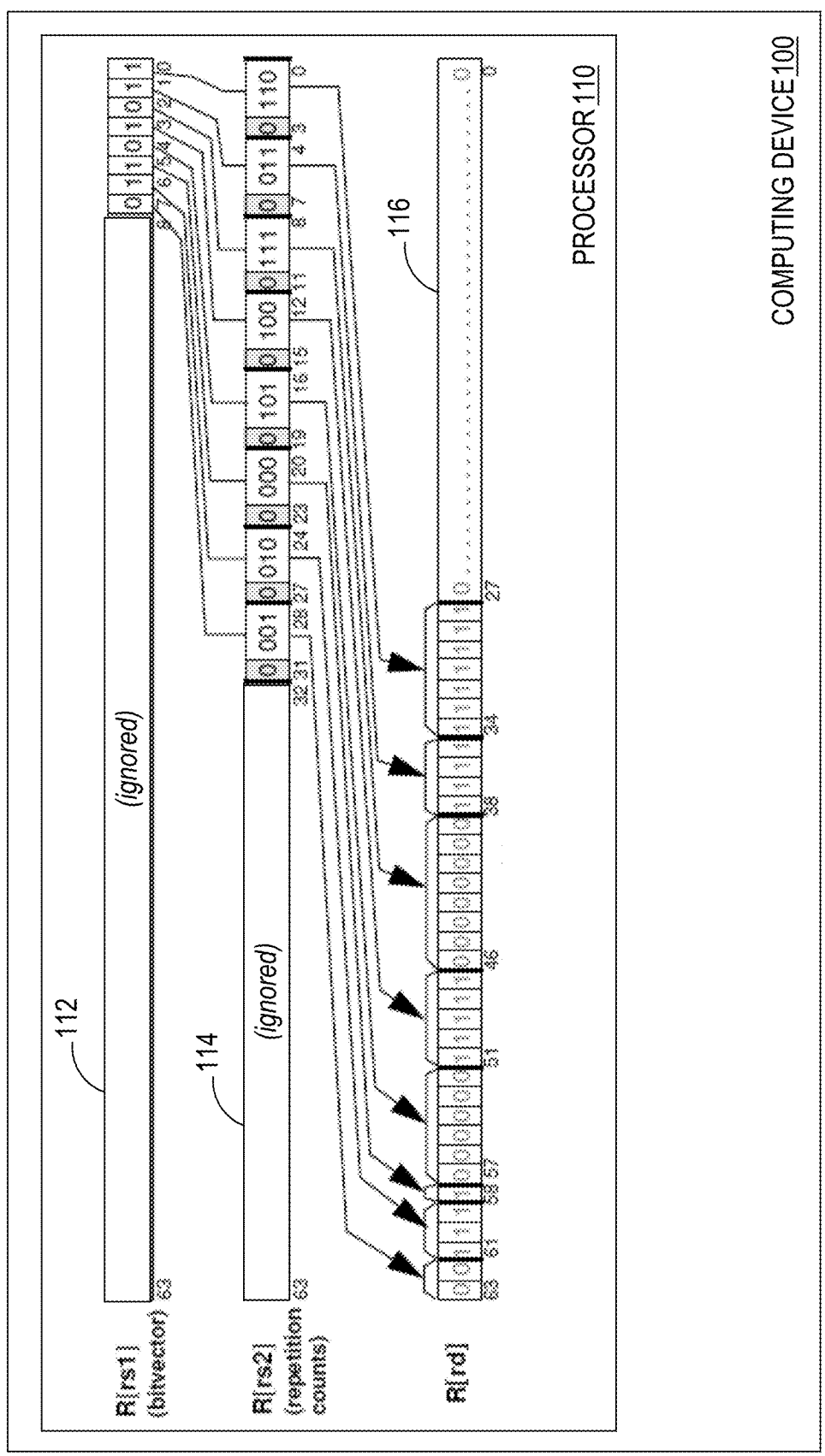
FIG. 1 depicts an example configuration for a computing device, in which a processor includes example registers that are configured for the execution of AN RLE_BURST specialized hardware instruction.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

General Overview

Approaches are described to improve database performance by implementing a run-length encoding (RLE) decompression function at a low level within a general-purpose processor or an external block. Specifically, embodiments of a hardware implementation of an instruction for RLE decompression are disclosed.

The described approaches improve performance by supporting the RLE decompression function within a processor and/or external block. For example, and with reference to FIG. 11 described in further detail below, a block external to processor 1100 could be attached via I/O interface 1150, or memory interface(s) 1140. The block could also be external to Cores 1110a . . . h, but internal to processor 1100. Furthermore, with reference to FIG. 12 described in further detail below, embodiments are implemented, at least in part, within one or more of execution units 1230 or floating point/graphics unit 1240.

Specifically, a RLE decompression hardware implementation is disclosed that produces a 64-bit RLE decompression result, with an example embodiment performing the task in two pipelined execution stages with a throughput of one per cycle. According to embodiments, hardware organization of narrow-width shifters operating in parallel, controlled by computed shift counts, is used to perform the decompression. Because of the decreased time required to perform RLE decompression according to embodiments, the performance of tasks that use embodiments described herein for decompression of run-length encoded data is made more efficient.

Specialized Hardware Instructions

Generally, the processor of a computing device performs tasks by executing series of machine instructions, which inform the device of what low-level operations the device should perform on data that is accessible at the device. Processors are used in a variety of applications ranging from desktop computers to cellular telephones. In some applications, multiple processors or processor cores, may be connected together so that computation tasks may be shared among the various processors. Whether used individually, or as part of group, processors make use of sequential logic circuits, internal memory, and the like, to execute program instructions and operate on input data, which may be represented in a binary numeral system.

Modern processors typically include various functional blocks, each with a dedicated task. For example, a processor may include an instruction fetch unit, a memory management unit, and an arithmetic logic unit (ALU). An instruction fetch unit may prepare program instructions for execution by decoding the program instructions and checking for scheduling hazards, while arithmetic operations such as addition, subtraction, and Boolean operations (e.g., AND, OR, etc.) may be performed by an ALU.

Most of the modern tasks that computing devices are required to perform are sufficiently complex that scripting these tasks entirely in machine instructions, without utilizing higher-level software instructions, is usually overly expensive. As such, most complex computing tasks are performed by supplying a computing device with low-level or machine instructions that are automatically compiled from higher-level software instructions. High-level software instructions are human-readable, and are designed to more easily represent complex computing tasks that would be prohibitive to represent using lower-level instructions because of the complexity of the tasks. While software instructions make it easier to instruct computing devices to perform complex tasks, many times, the high-level software instructions are automatically compiled into low-level instructions that are not as efficient as they could be.

Performance of complex computing tasks can be made more efficient by incorporation of hardware instructions that are configured to optimally perform a specialized function. Such hardware instructions may be used to perform the specialized function in conjunction with other software or hardware instructions in order to streamline performance of the specialized function. Hardware instructions may be used independent from higher-level software instructions.

Register Data for RLE_BURST

According to embodiments, a hardware instruction (referred to herein as "RLE_BURST") for efficiently decompressing RLE-encoded data is described. Specifically, RLE_BURST converts a compressed data stream, compressed according to RLE, into an uncompressed data stream.

In an embodiment, RLE_BURST expands a run-length encoded value, of at most eight bits, into an uncompressed result of as many as 64 bits. Each bit of the RLE-encoded 8-bit value is replicated a number of times indicated by a run length that corresponds to the bit.

FIG. 1 depicts an example configuration for a computing device 100, in which a processor 110 includes example registers 112, 114, and 116 that are configured for the execution of RLE_BURST specialized hardware instruction. Registers 112, 114, and 116 are 64-bit registers, where each bit is numbered 0-63 with the lowest-numbered bit representing the least significant bit (LSB) of the register.

According to the embodiment depicted in FIG. 1, the instruction RLE_BURST is provided with information identifying three registers: register 112 ("R[rs1]") storing the run-length encoded value to be decompressed; register 114 ("R[rs2]") storing the run lengths for each bit in the run-length encoded value; and register 116 ("R[rd]") to which RLE_BURST will write the resulting decompressed value. Example syntax for the hardware instruction according to such an embodiment is as follows.

RLE_BURST R[rs1], R[rs2], R[rd]

According to an embodiment, RLE_BURST decompresses values that are at most eight bits long. Accordingly, register 112 stores eight bits of data at positions 0-7 of the register. Each bit in register 112 is expanded individually. In other words, each bit of the compressed value corresponds with a corresponding run length value that indicates how many times the bit should be replicated.

RLE_BURST also accepts a vector of run-length values, where each run-length value in the vector corresponds to a particular bit of the value to be decompressed. Accordingly, register 114 stores eight run length values that respectively correspond to the bits of the compressed value. More specifically, in the example of FIG. 1, register 114 stores eight 3-bit biased run-length values.

The maximum run length represented in register 114 is eight, which allows the run-length values to be represented by three bits each. Specifically, according to embodiments, a run length value is represented in register 114 as a biased value, which means that the value represented in the register is one less than the run-length value to be applied to the corresponding bit in the RLE-encoded value. For example, if register 114 stores "010" (in base-2, which is equal to "2" in base-10) for a particular biased run-length value, then the number of times that the corresponding bit in the encoded value should be replicated is one more, or "011" (in base-2, which is equal to "3" in base-10).

The values are biased in register 114, and the maximum run-length value for a particular bit for RLE_BURST is eight and the minimum is one. Thus, any run length value to be represented in register 114 is representable using three bits since the largest value representable by three base-2 digits is "111", which is equal to "7" in base-10.

Returning to FIG. 1, each of the eight possible run-length values are represented by three bits each. In the depiction of FIG. 1, register 114 has four bits dedicated to each run-length value and, according to embodiments, the MSB of each 4-bit biased run-length is ignored. The following Table 1 represents example mappings between bits of the encoded value (i.e., "source bits") in register 112 and run-length values represented in register 114. Since the table refers to the biased values represented by the bits in register 114, Table 1 shows one being added to each value to produce unbiased run-lengths.

TABLE 1

| Source bit from R[rs1] | Duplicate source bit the number of times indicated by |
|---|---|
| 7 | R[rs2]{30:28} + 1 |
| 6 | R[rs2]{26:24} + 1 |
| 5 | R[rs2]{22:20} + 1 |
| 4 | R[rs2]{18:16} + 1 |
| 3 | R[rs2]{14:12} + 1 |
| 2 | R[rs2]{10:08} + 1 |
| 1 | R[rs2]{06:04} + 1 |
| 0 | R[rs2]{02:00} + 1 |

According to other embodiments, an alternative number of bits is used to represent the run lengths for RLE_BURST. In an example embodiment, four bits are used to represent the run lengths in register 114, e.g., using biased or unbiased value representations. Such use of four bits to represent each run length would allow a run length to indicate that a particular bit from the source RLE value should be replicated up to 16 times (if biased representations are being used) or up to 15 times (if unbiased representations are being used).

Register 116 stores the decompressed result data, left justified, and padded with zeros on the right as required. The following Table 2 details the positions of the duplicated source bits in the decompressed result data in register 116.

TABLE 2

| Source bit from R[rs1] | Duplicated bits are written to |
|---|---|
| 7 | R[rd]{63:(63-R[rs2]{30:28})} |
| 6 | next R[rs2]{26:24} + 1 bits of R[rd] |
| 5 | next R[rs2]{22:20} + 1 bits of R[rd] |
| 4 | next R[rs2]{18:16} + 1 bits of R[rd] |
| 3 | next R[rs2]{14:12} + 1 bits of R[rd] |
| 2 | next R[rs2]{10:08} + 1 bits of R[rd] |
| 1 | next R[rs2]{06:04} + 1 bits of R[rd] |
| 0 | next R[rs2]{02:00} + 1 bits of R[rd] remaining R[rd] bits are set to 0 |

RLE_BURST Implementation

FIG. 2 depicts a flowchart 200 for decompressing an RLE-encoded value using a specialized hardware instruction, according to embodiments. At step 202, an instruction to decompress a run-length-encoded (RLE) value is received; wherein the RLE value comprises a plurality of bits; and wherein each bit, of the RLE value, corresponds to a corresponding run length of a plurality of run lengths. According to an embodiment, an instruction fetch unit of processor 110 fetches an RLE_BURST instruction from main memory of computing device 100. The format of the RLE_BURST instruction fetched from memory may be any format that is understood by processor 110.

To illustrate, processor 110 receives an RLE_BURST instruction to decompress the following RLE-encoded value "abcdefgh", which, according to an embodiment, processor 110 retrieves from a register such as register 112. The characters in the example RLE-encoded value are distinct alphabetical characters to ease explanation of the functioning of RLE_BURST. However, in implementation, the RLE-encoded value would be in a standard format represented by registers in processor 110, which is generally limited to base-2 bits that can represent '1' or '0'.

Each bit in the RLE-encoded value "abcdefgh" corresponds to a corresponding run length, e.g., which processor 110 retrieves from a register such as register 114. For ease of explanation, the run lengths for all bits of RLE-encoded value "abcdefgh" are four.

At step 204, in response to receiving the instruction to decompress the RLE value, a set of actions, that are indicated in a definition of the instruction, are performed. For example, after fetching the instruction, the instruction fetch unit decodes the instruction to identify the set of actions required by the received RLE_BURST instruction. This set of actions, into which the instruction is decoded, accomplish one or more (or all) of steps 206, 208, and 210 of flowchart 200.

At step 206, each bit, of the RLE value, is replicated a number of times indicated by the corresponding run length that corresponds to the bit, to produce a plurality of replicated values, each of which corresponds to a corresponding bit of the RLE value. For example, processor 110 performs the steps of flowchart 300 of FIG. 3, which depicts replicating the bits of an RLE-encoded value based on run lengths that respectively correspond to the bits, according to embodiments.

At step 302, a set of intermediate values are generated, wherein each of the intermediate values, of the set of intermediate values, corresponds to a corresponding bit of the RLE value; wherein all of the intermediate values, of the set of intermediate values, have the same number of bits, respectively; and wherein all of the bits of each intermediate value, of the set of intermediate values, have the value of the bit of the RLE value that corresponds to the intermediate value.

Figure 4:
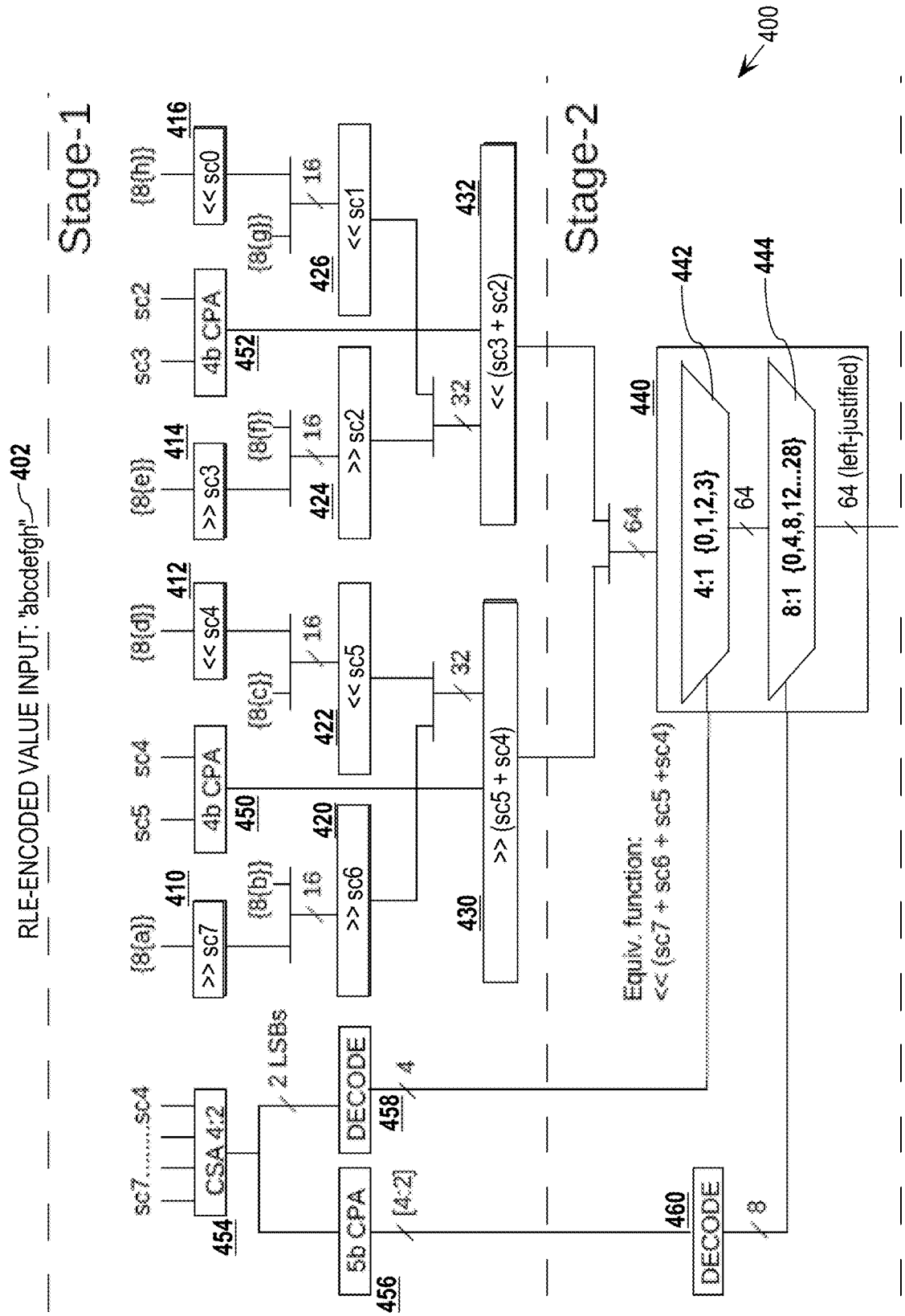
FIG. 4 depicts a block diagram illustrating actions, to be performed by a processor, for decompressing an RLE-encoded value.

For example, processor 110 decompresses the RLE-encoded value according to the actions indicated in block diagram 400 of FIG. 4. Diagram 400 depicts a non-limiting embodiment, and as such, one or more of the features of diagram 400 may be implemented in other ways, according to embodiments.

In diagram 400, shifters, multiplexors, carry propagate adders (CPAs), the carry save adder (CSA), and the decoders may be implemented, in processor 110, in any manner, e.g., using low-level components such as logic gates, registers, etc. The shifters depicted in diagram 400 have both (a) width, and (b) a number of bits that it is capable of shifting. A 7-bit shifter is a shifter with that has the capability of shifting up to seven bits.

In diagram 400 (as in register 112 of FIG. 1), the bits of RLE-encoded value 402 ("abcdefgh") are referred to as the most significant bit (MSB) being at position 7 and the least significant bit (LSB) being at position 0. Also, the shift counts corresponding to the bits of value 402 are referred to in diagram 400 by the position of the bit to which the shift count corresponds. For example, in diagram 400, the shift count of the LSB of value 402 is referred to as "sc0".

Figure 5:
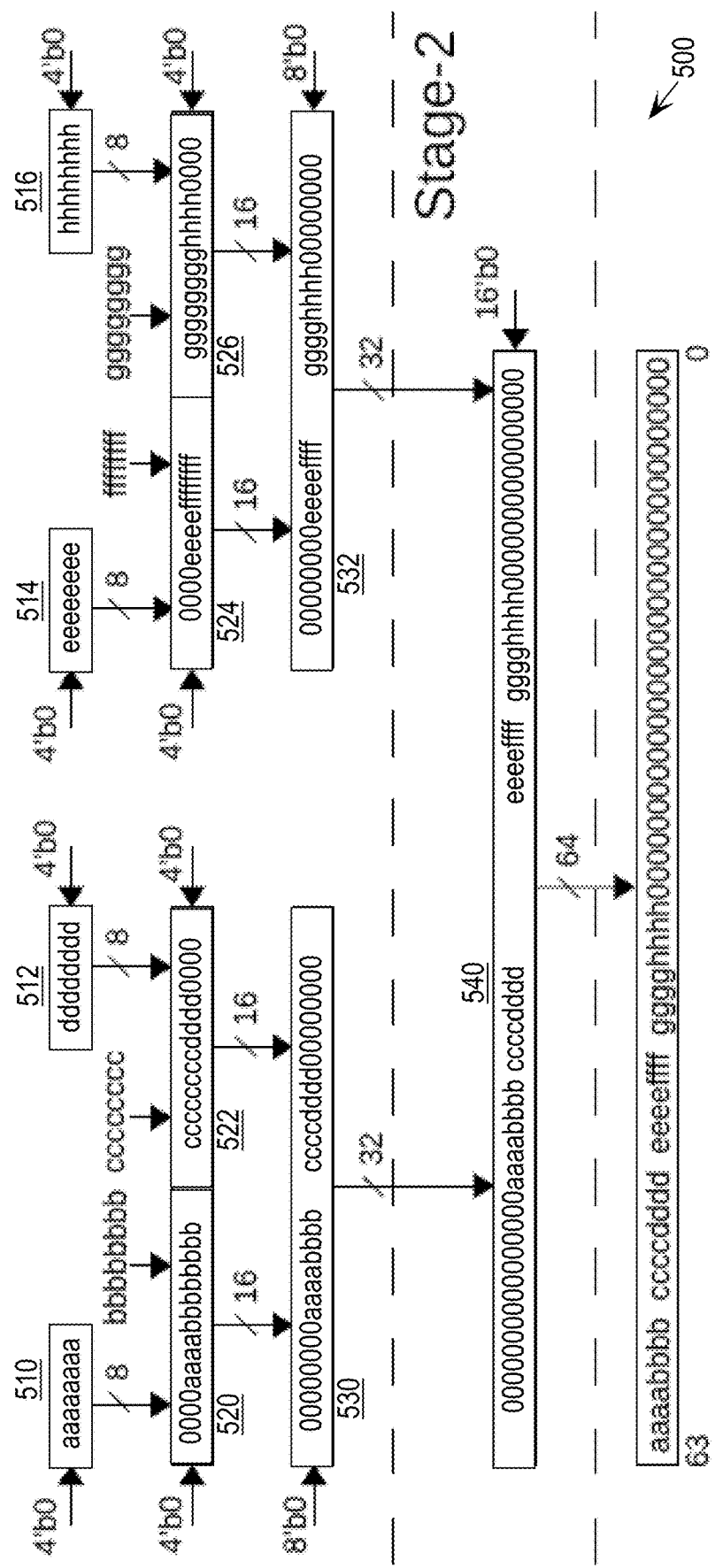
FIG. 5 depicts an example diagram illustrating processing of an example RLE-encoded value according to the diagram of FIG. 4.

FIG. 5 is an example diagram 500 that depicts processing of value 402 according to diagram 400. To begin the process of duplicating the bits of value 402, processor 110 fills each of 7-bit shifters 410, 412, 414, and 416 with 8 bits of 'a', 'd', 'e', and 'h', respectively, from value 402. To illustrate filling the 7-bit shifters, corresponding shifters 510, 512, 514, and 516 are shown in diagram 500 as filled with the indicated eight bits.

Shift Counts

At step 304 of FIG. 3, zero or more bits are shifted out of one or more intermediate values, of the set of intermediate values, to produce one or more adjusted intermediate values; wherein the number of bits shifted out of each of the one or more adjusted intermediate values is based, at least in part, on the corresponding run length that corresponds to the bit, of the RLE value, that corresponds to the intermediate value; and wherein the plurality of replicated values consists of the one or more adjusted intermediate values and any intermediate values, of the set of intermediate values, other than the one or more adjusted intermediate values.

For example, processor 110 calculates shift counts for each of the shifters 410, 412, 414, and 416, i.e., "sc7", "sc4", "sc3", and "sc0", which correspond to bits 7, 4, 3, and 0 of value 402 with which the shifters are filled. Given a maximum run-length of N, shift count is defined by the equation:

shift_count=$N$–run_length

As described above and according to embodiments, the run lengths provided to processor 110 for the RLE_BURST instruction are represented as biased values. When represented as a biased value, the run length for a particular bit can be easily converted to a shift count for the bit by inverting the biased run-length value, as shown in the following equation:

shift_count=~biased_run_length

According to further embodiments, a run length is represented, in the appropriate register indicated by the RLE_BURST instruction, as an unbiased value. Performing a 2's complement on an unbiased run length will produce the corresponding shift count, as indicated by the following equation.

shift_count=~run_length+1

Given a maximum run length of 8, performing a 2's complement on an unbiased run length produces a 3-bit value indicating appropriate shift count between 7 and 0. Performing a 1's complement on the biased run length is equivalent to performing a 2's complement on the unbiased run length.

To illustrate calculating the shift count according to the methods described above, given a maximum run length of 8, a run length equal to 6 and a biased run length equal to 5, the expected shift count is 8-6, which equals 2. The three-bit binary representation of 6 is "110", and the 2's complement is "010" (decimal 2). The 3-bit binary representation of 5 is "101", and the 1's complement is "010" (decimal 2).

Returning to the example of FIGS. 4 and 5, processor 110 shifts the eight 'a' bits in shifter 410 to the right by the shift count "sc7". As such, processor 110 shifts out, of shifter 410, the number of bits indicated by "sc7". According to embodiments, processor 110 shifts the character '0' into shifter 410 when processor 110 shifts bits out of the shifter. Thus, after being shifted, the value in shifter 410 has the number of 'a' bits that is indicated by the run length that is associated with bit 7 of value 402. To illustrate, the value, in shifter 410, after shifting based on the corresponding shift count ("sc7"=4) is "0000aaaa".

Similarly, processor 110 shifts the value in shifter 412 to the left by shift count "sc4", shifts the value in shifter 414 to the right by shift count "sc3", and the value in shifter 416 to the left by shift count "sc0". As indicated by the fact that the blocks for shifters 410, 412, 414, and 416 are placed on the same level (or row), processor 110 performs the shifting functions for these shifters in parallel.

Returning to flowchart 200 of FIG. 2, at step 208, the replicated values, of the plurality of replicated values, are concatenated in the same order as the bits of the RLE value to which the replicated values correspond, to produce a decompressed value. For example, processor 110 begins the process of concatenating replicated bits using shifters 420, 422, 424, and 426 of diagram 400, which are also 7-bit shifters.

Specifically, as indicated in diagram 400, the MSBs of shifter 420 are initialized with eight instances of bit 'b' and the LSBs of shifter 422 are initialized with the resulting value from shifter 410. As indicated in diagram 500, the corresponding shifter 520 (that corresponds with shifter 420 of FIG. 4) initially holds "0000aaaabbbbbbbb". Shifter 420 is shifted to the right by shift count "sc6", which is the shift count that corresponds to bit 6 of value 402 (i.e., 'b'). After being shifted, the value in shifter 420 includes the number of 'a' bits and the number of 'b' bits that are indicated by the corresponding run lengths for those bits of value 402. To illustrate, the value, in shifter 420, after shifting by shift count ("sc6"=4) is "00000000aaaabbbb".

Similarly, as shown in corresponding shifter 522 of FIG. 5, the MSBs of shifter 422 are initialized with eight instances of bit 'c' and the LSBs of shifter 422 are initialized with the value ("dddd0000") from shifter 412. Then shifter 422 is shifted to the left by shift count "sc5" resulting in the value "ccccdddd00000000" in shifter 422.

As shown in corresponding shifter 524 of FIG. 5, the MSBs of shifter 424 are initialized with eight instances of bit 'f' and the LSBs of shifter 424 are initialized with the value ("0000eeee") from shifter 414. Then shifter 424 is shifted to the right by shift count "sc2" resulting in the value "00000000eeeeffff" in shifter 424.

Similarly, as shown in corresponding shifter 526 of FIG. 5, the MSBs of shifter 426 are initialized with eight instances of bit 'g' and the LSBs of shifter 426 are initialized with the value ("hhhh0000") from shifter 416. Then shifter 426 is shifted to the left by shift count "sc1" resulting in the value "gggghhhh00000000" in shifter 426.

As indicated by shifters 420, 422, 424, and 426 being on the same level in diagram 400, the shift operations performed on these shifters are performed by processor 110 in parallel.

Shifters 430 and 432 of diagram 400 are 14-bit shifters, and the shift operations corresponding to these shifters are performed in parallel. As indicated in diagram 400, the MSBs of shifter 430 are initialized with the resulting value from shifter 420 (i.e., "00000000aaaabbbb") and the LSBs of shifter 430 are initialized with the resulting value from shifter 422 (i.e., "ccccdddd00000000").

The initial value in shifter 430 is shown in corresponding shifter 530 of FIG. 5. As is depicted in shifter 530 of FIG. 5, the correct number of each of bits 'a', 'b', 'c', and 'd' have been shifted such that they are in the middle of the value with which shifter 430 is initially populated, without any unused bits intervening between the replicated bits of value 402 represented in shifter 430. Unused bits are bits that do not represent any part of the decompressed value being produced by processor 110, such as the bits that are shifted into the shifters.

In order to combine the intermediate decompressed value in shifter 430 with the intermediate decompressed value in shifter 432 without unused bits between the properly decompressed bits, the value in shifter 430 is shifted to the right by a number of bits indicated by "sc5+sc4". The quantity "sc5+sc4" represents the number of bits that have been shifted in to the right by shifters 412 and 422. Thus, when the value in shifter 430 is shifted to the right by "sc5+sc4" number of bits, then the decompressed value in shifter 430 will be right-justified. As such, the value resulting from the shift operation at shifter 430 is "0000000000000000aaaabbbbccccdddd".

According to the embodiment depicted in FIG. 4, performance of a CPA 450 (which is utilized to add the values of "sc5" and "sc4" together) and a CPA 452 (which is utilized to add the values of "sc3" and "sc2" together) are initiated in parallel with shifters 410-416. It takes time to add values together, and starting the adding process at the beginning of the decompression process gives CPAs 450 and 452 time to generate results before the sums are needed at shifters 430 and 432, respectively.

In a manner similar to shifter 430, the MSBs of shifter 432 are initialized with the resulting value from shifter 424 (i.e., "00000000eeeeffff") and the LSBs of shifter 432 are initialized with the resulting value from shifter 426 (i.e., "ggggh-hhh00000000"). The initial value in shifter 432 is shown in corresponding shifter 532 of FIG. 5. As is depicted in shifter 532 of FIG. 5, the correct number of each of bits 'e', 'f', 'g', and 'h' have been shifted such that they are in the middle of the value with which shifter 432 is initially populated without any unused bits intervening between the replicated bits of value 402.

In order to combine the right-justified value in shifter 430 with the value in shifter 432 without unused bits between the properly replicated bits, the value in shifter 432 is shifted to the left by a number of bits indicated by "sc3+sc2". The quantity "sc3+sc2" represents the number of bits that have been shifted in to the left by shifters 414 and 424. Thus, when the value in shifter 432 is shifted to the left by "sc3+sc2" number of bits, then the replicated value in shifter 432 (that has all of the properly replicated bits from value 402 and no intervening unused bits) will be left-justified. As such, the value resulting from the shift operation at shifter 432 is "eeeeffffggggghhhh0000000000000000".

Shifter 440 is a 28-bit shifter, by which shifter 440 left-justifies the stored (and fully decompressed) value. Specifically, shifter 440 is initialized with the result from shifter 430 in the MSBs of shifter 440 and with the result from shifter 432 in the LSBs of shifter 440, as depicted in the corresponding shifter 540 of diagram 500. According to the embodiment depicted in FIG. 4, 28 bits is the largest number of bits that shifter 440 would have to shift the resulting decompressed value. Given an 8-bit input where each bit will be represented at least once in the output, at most 28 bits of unused bits will appear in the MSBs of the value resulting from shifter 430.

Depiction of shifter 440 is more detailed in FIG. 4 than the depiction of other shifters, providing an implementation of this 28-bit shifter comprising a multiplexer (MUX) 442 and a MUX 444. In order to allow shifter 440 to shift a value by 28 bits, MUX 442 is a 4:1 multiplexer that can shift by 0, 1, 2, or 3 bits, and MUX 444 is an 8:1 multiplexer that can shift by 0, 4, 8, 12, 16, 20, 24, or 28 bits. Together, MUX 442 and MUX 444 can shift a value by up to 28 bits.

More specifically, processor 110 uses shifter 440 to shift out the unused bits that have been shifted into the high-order bits, of the decompressed value, by shifters 410, 420, and 430. The number of unused bits located to the left of the representation of the decompressed value, with which shifter 440 is initially loaded, is sc7+sc6+sc5+sc4.

CSA 454, CPA 456, decoder 458, and decoder 460 produce the inputs required by MUX 442 and MUX 444 in order to left-justify the decompressed value. Specifically, CSA 454 receives, as input, the shift counts "sc7", "sc6", "sc5", and "sc4". CSA 454 produces two outputs, the sum of which equals sc7+sc6+sc5+sc4. Decoder 458 receives the two LSBs from the two outputs of CSA 454, and from these values, determines which option of MUX 442 should be selected (i.e., shift by 0, 1, 2, or 3 bits). For example, decoder 458 adds the two LSBs from the two outputs of CSA 454 together and produces a set of four selects dependent upon the four possible values of the two-bit sum. Decoder 458 outputs four bits with the identified selection selected within the bits.

CPA 456 adds the outputs from CSA 454 and decoder 460 determines which bit, of its eight output bits should be selected based on the sum from CPA 456. MUX 444 shifts the value resulting from shifting performed by MUX 442 based on the selection from decoder 460. The result from shifter 440 is the fully decompressed value that is left-justified, i.e., with no leading unused bits in the MSBs of the representation of the decoded value.

At step 210 of flowchart 200, the decompressed value is stored as a result of the instruction to decompress the RLE value. For example, processor 110 stores the decompressed value resulting from shifter 440 in the result register that was indicated in the RLE_BURST instruction.

RLE BURST Based on Two Stages

As depicted in diagram 400, the functions implementing RLE_BURST are timed such that they can be performed in two stages, corresponding to respective clock cycles. This depends on the length of the clock cycle, according to particular implementations. As described above, Level-1 utilizes four 7-bit shifts in parallel, followed by level-2 with four 7-bit shifts in parallel, followed by level-3 with two 14-bit shifts in parallel.

Within stage-2, the two intermediate 32-bit results (high and low) from stage-1 are merged into a final 64-bit result by eliminating any left padded zeros within the high 32-bits generated by stage-1. This is accomplished using one 28-bit shifter (level-4).

By performing the indicated functions in parallel, the functions are configured to be performed in the two stages. Embodiments are not limited to the configuration depicted in FIGS. 4 and 5.

RLE_BURST Alternative Process

Figure 6:
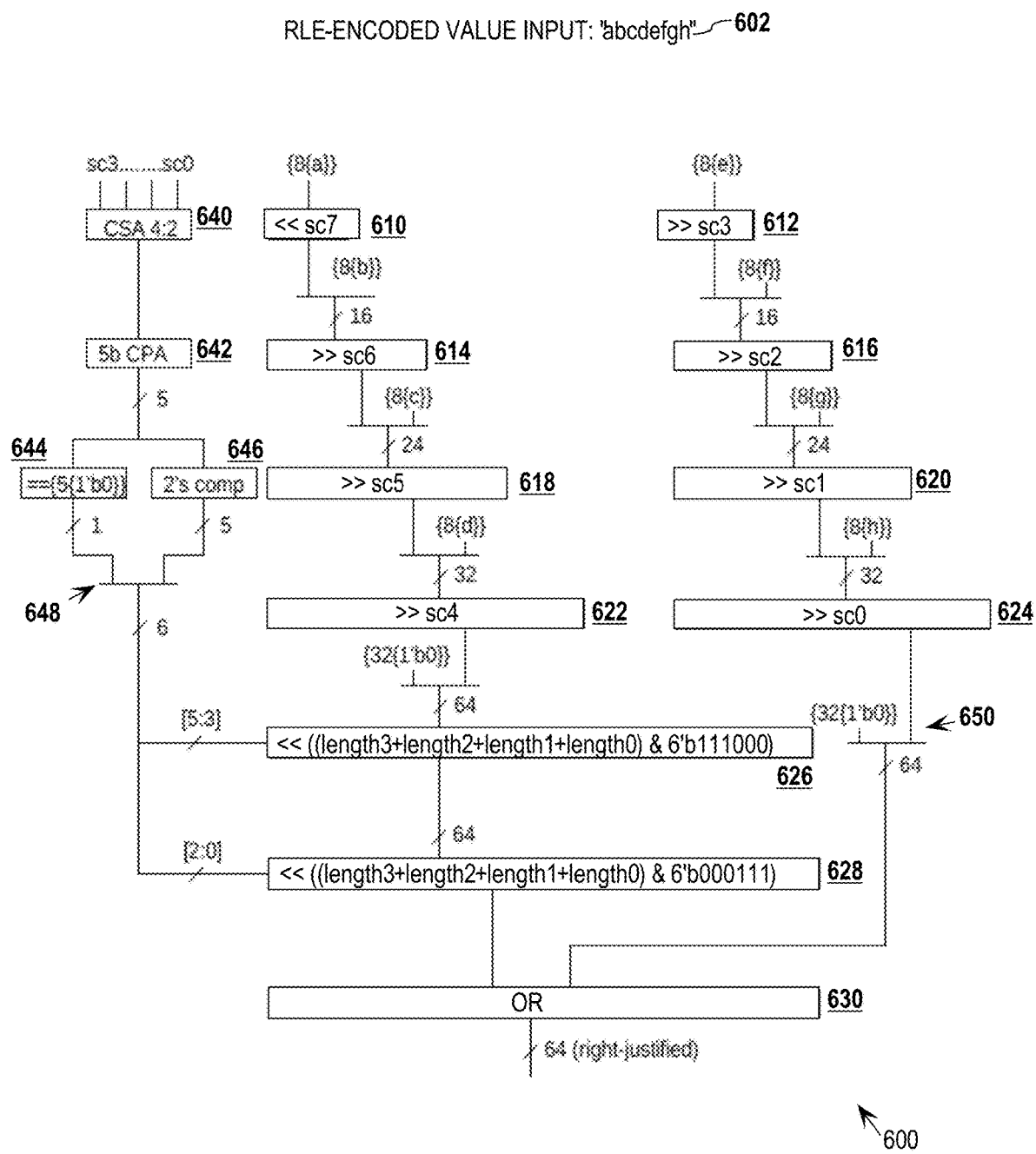
FIG. 6 depicts a block diagram illustrating actions, to be performed by a processor, for decompressing an RLE-encoded value.
Figure 7:
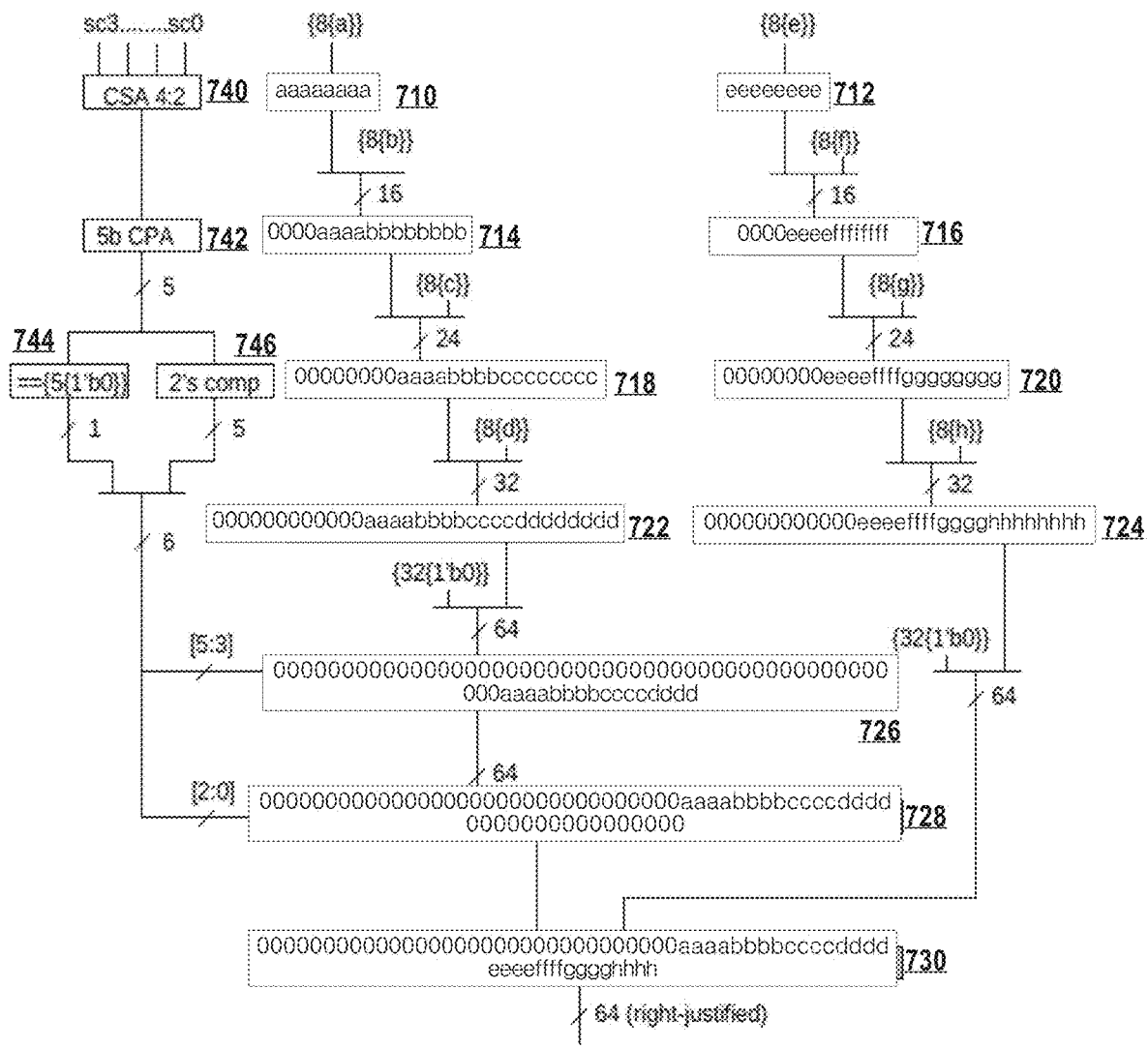
FIG. 7 depicts an example diagram illustrating processing of an example RLE-encoded value according to the diagram of FIG. 6.

FIG. 6 depicts a block diagram 600 that represents an alternative implementation of RLE_BURST. FIG. 7 depicts an example diagram 700 that runs an RLE-encoded value 602 through the indicated shifters, where each bit of value 602 is associated with a run length of four. In diagram 600, shifters 610-620 and 628 are 7-bit shifters and shifter 626 is a 32-bit shifter. As referred to herein, reference numbers 610-646 of FIG. 6 correspond to the similar reference numbers 710-746 of FIG. 7 respectively.

On the first level of diagram 600, shifters 610 and 612 are 7-bit shifters that are initialized with eight instances of the MSB of RLE-encoded value 602, 'a', and eight instances of the bit at position 3 in RLE-encoded value 602, or 'e', respectively. Shifter 610 is shifted to the right by the shift count "sc7" and shifter 612 is shifted to the right by the shift count "sc3".

On the second level of diagram 600, shifter 614 receives the shifted value from shifter 610 to initialize the eight MSBs of shifter 614, and is initialized with eight instances of bit 'b' from RLE-encoded value 602. As shown in corresponding shifter 714 of diagram 700, shifter 614 is initialized with the value "0000aaaabbbbbbbb". Similarly, shifter 616 receives the shifted value from shifter 612 to initialize the eight MSBs of shifter 616, and the LSBs of shifter 616 are initialized with eight instances of bit 'f' from RLE-encoded value 602. As shown in corresponding shifter 716 of diagram 700, shifter 616 is initialized with the value "0000eeeeffffffff". Shifter 614 is shifted to the right by the shift count "sc6" and shifter 616 is shifted to the right by the shift count "sc2".

On the third level of diagram 600, the MSBs of shifter 618 are initialized with the shifted value from shifter 614 and the LSBs of shifter 618 are initialized with eight instances of bit 'c' from value 602. As such, shifter 618 is initialized with the value "00000000aaaabbbbcccccccc", as depicted in corresponding shifter 718 in diagram 7. The MSBs of shifter 620 are initialized with the shifted value from shifter 616 and the LSBs of shifter 620 are initialized with eight instances of bit 'g' from value 602. As such, shifter 620 is initialized with the value "00000000eeeeffffgggggggg", as depicted in corresponding shifter 720 in diagram 700. Shifter 618 is shifted to the right by the shift count "sc5" and shifter 620 is shifted to the right by the shift count "sc1".

On the fourth level of diagram 600, the MSBs of shifter 622 are initialized with the shifted value from shifter 618 and the LSBs of shifter 622 are initialized with eight instances of bit 'd' from value 602. As such, shifter 622 is initialized with the value "000000000000aaaabbbbcccdddddddd", as depicted in corresponding shifter 722 in diagram 7. The MSBs of shifter 624 are initialized with the shifted value from shifter 620 and the LSBs of shifter 624 are initialized with eight instances of bit 'h' from value 602. As such, shifter 624 is initialized with the value "000000000000eeeeffffggggghhhhhhhh", as depicted in corresponding shifter 724 in diagram 700. Shifter 622 is shifted to the right by the shift count "sc4" and shifter 624 is shifted to the right by the shift count "sc0".

The shift count of shifter 626 is based on the quantity: ("length3"+"length2"+"length1"+"length0") & 6'b111000, where the run length for a particular bit 'x' is represented by "lengthx" (for example, "length0" represents the run length for the LSB of value 602). This quantity masks off (or sets to zero) the three LSB's of the sum of the run lengths, and therefore allows the shifter to shift by 0, 8, 16, 24, or 32 bits depending on the value of the result of the quantity. In order to calculate the shift count for shifter 626 (and also for shifter 628), CSA 640 receives the four inputs "sc3", "sc2", "sc1", and "sc0" and produces two outputs, the sum of which equals "sc3"+"sc2"+"sc1"+"sc0" (according to the example above, this sum is 4+4+4+4=16).

CPA 642 adds the two outputs from CSA 640 and sends the resulting five bits to zero detector 644 and to 2's complement converter 646. The 2's complement converter 646 converts the output from CPA 642 into the 2's complement of the represented value. For example, the 2's complement of 10000 (16 in base-10) is 10000. Zero detector 644 outputs a single bit with a value of '1' if the five bits resulting from CPA 642 are all '0'. If any of the values of the bits resulting from CPA 642 is '1', then zero detector 644 outputs the value '0'. The result from zero detector 644 is concatenated to the MSB of the value resulting from 2's complement converter 646 at operation 648.

The result from operation 648 is used for the shift counts of shifters 626 and 628. CSA 640 is on the first level of diagram 600, and as such, its processing is performed in parallel with shifters 610 and 612. CPA 642 is on the second level of diagram 600, and as such, its processing is performed in parallel with shifters 614 and 616. Zero detector 644 and 2's complement converter 646 are on the third level of diagram 600, and as such, the processing represented thereby is performed in parallel with shifters 618 and 620.

The LSBs of shifter 626 are initialized with the shifted value from shifter 622, and the MSBs of shifter 626 are initialized with 32 '0' bits. As such, and as depicted in the corresponding shifter 726 of diagram 700, shifter 626 is initialized with the value "000000000000000000000000000000000000aaaabbbbccccdddd". Based on run lengths of four for each bit of value 602, the quantity ("length3"+"length2"+"length1"+"length0") & 6'b111000 is equal to 16 (base-10), or 010000 (base-2). Further, the quantity 010000 & 6'b111000 is equal to 010000. As such, shifter 626 shifts its initialized value to the left by 16 bits, resulting in the value "000000000000000000000000000000000000aaaabbbbccccdddd0000000000000000".

Shifter 628 is a 7-bit shifter, and the shift count for shifter 628 is calculated as ("length3"+"length2"+"length1"+"length0") & 6'b000111. ANDing the quantity 6'b000111 to the sum of the run lengths for bits 0-3 of value 602 masks off the three MSBs of the sum of the run lengths. The three LSBs of the sum can represent a number of up to seven. Between the two shifters 626 and 628, the value from shifter 622 can be shifted any amount of bits up to 32. According to embodiments, shifters 626 and 628 are implemented as two multiplexers, with shifter 626 being implemented by a 5:1 multiplexer and shifter 628 being implemented by an 8:1 multiplexer.

Shifter 628 is initialized with the shifted value from shifter 626. As such, and as depicted in the corresponding shifter 728 of diagram 700, shifter 628 is initialized with "000000000000000000000000000000000000aaaabbbbccccdddd0000000000000000". Since the three LSBs of the result of "length3"+"length2"+"length1"+"length0" (i.e., 010000) are zero, shifter 628 does not shift the initialized value.

OR gate 630 combines the resulting value from shifter 628 and the value resulting from shifter 624 (with 32 '0' bits concatenated to the MSBs of that value, as indicated by operation 650) as follows. 000000000000000000000000000000000000aaaabbbbccccdddd0000000000000000 OR 000000000000000000000000000000000000000000eeeeffffggggghhhh The value resulting from OR gate 630 is the right-justified and fully-decompressed value "000000000000000000000000000000000000aaaabbbbccccddddeeeeffffggggghhhh", as depicted at OR gate 730 of diagram 700.

RLE_LENGTH

According to embodiments, processor 110 is further configured to perform an instruction, called RLE_LENGTH, that determines the length of a decompressed value resulting from a call to RLE_BURST based on the registers configured for the RLE_BURST instruction. Specifically, FIG. 8 depicts a set of registers 800 on which, according to an example, a call to RLE_LENGTH is based. Register 810 indicates biased run lengths for each bit of a value to be decompressed by RLE_BURST. As described above, embodiments are not limited to use of biased run lengths.

According to an embodiment, and as indicated by summation 830, when such an RLE_LENGTH instruction is called, processor 110 adds one to each biased run length, and then sums the resulting values to produce the total length of the corresponding decompressed value. This length value is stored in the LSBs of the result register 820 indicated in the RLE_LENGTH instruction.

For example (continuing with the example of FIGS. 4 and 5), processor 110 receives an instruction to determine the length of the decompressed value resulting from decompressing value 402. Processor 110 adds one to each biased run length in the indicated register to produce the run length values for each bit in value 402. According to the example given above, the run lengths for all of the bits of value 402 are four. As such, processor 110 determines that the total run length of the resulting decompressed value is 32 bits.

According to an embodiment, processor 110 sums the biased run length values from the indicated register and adds 8 to the result to produce the total length of the corresponding decompressed value.

According to an embodiment, processor 110 calculates the total length of a decompressed value (that is based on the run lengths in the register provided to the RLE_LENGTH command) based on the shift counts for the indicated run lengths, i.e., as described in connection with step 304 of flowchart 300 (FIG. 3). As indicated above, the shift count (for a particular run length) represents the particular corresponding run length in 2's complement form. To produce a total length for the final decompressed value, processor 110 sums the shift counts for all of the run lengths and calculates the 2's complement of the sum of the shift counts, which results in the total length value. In the special case where all of the run lengths are equal to 8 (and the sum of all of the corresponding shift counts is 0), the 2's complement of the sum of the shift counts is 0, which is not the correct total length of the corresponding decompressed value. In this special case, the RLE_LENGTH result is automatically set to 64.

Hardware being used in connection with the implementation of RLE_BURST depicted in FIG. 4 may be used to implement RLE_LENGTH, especially in embodiments where the register holding run lengths for RLE_BURST is configured with the same format as the register holding run lengths for RLE_LENGTH. For example, in the context of FIG. 4, the implementation in diagram 400 of RLE_BURST includes a CSA 454 that sums the shift counts "sc7", "sc6", "sc5", and "sc4". Processor 110 adds the result of CSA 454 with the result of another CSA (not shown in FIG. 4) that calculates the sum of shift counts "sc3", "sc2", "sc1", and "sc0" to find the sum total of all shift counts. In this manner, and according to embodiments, processor 110 leverages at least a portion of the hardware implemented for RLE_BURST in order to implement RLE_LENGTH.

The following Table 3 depicts an example set of run lengths, where the run lengths are shown as (a) unbiased values, (b) biased values, and (c) corresponding shift_count values. (All values are represented in base-10.)

TABLE 3

| Unbiased lengths | Biased lengths | Shift count |
|---|---|---|
| 4 | 3 | 4 |
| 2 | 1 | 6 |
| 5 | 4 | 3 |
| 8 | 7 | 0 |
| 1 | 0 | 7 |
| 7 | 6 | 1 |
| 1 | 0 | 7 |
| 3 | 2 | 5 |

The sum of the unbiased lengths is 31, which is equal to eight plus the sum of the biased lengths (23). The sum of the shift counts is 33, the 2's complement of which is 31 (i.e., the sum total of the run lengths).

Using RLE_LENGTH to Compress Out Unused Bits from the Result

It is highly unlikely that every decompressed value resulting from a call to RLE_BURST will use all 64 bits with which the decompressed value is represented. As such, concatenating multiple decompressed values resulting from calls to RLE_BURST would result in unused bits being included between the decompressed values. The length of a decompressed value, as calculated based on an RLE_LENGTH instruction, can be used to compress out unused bits from between decompressed values.

FIG. 9 depicts a flowchart 900 for using RLE_LENGTH to compress out unused bits between two decompressed values that were decompressed by RLE_BURST, according to embodiments. At step 902, a second instruction to decompress a second RLE value is received. Continuing with the example of flowchart 200 above, processor 110 fetches a second RLE_BURST instruction from main memory of computing device 100.

At step 904, in response to receiving the second instruction, the set of actions are performed, based on information for the second RLE value, to produce a second decompressed value. For example, receipt of the second instruction triggers processor 110 to decode the instruction to identify the same set of actions, described above, that are required by the received RLE_BURST instruction.

Accordingly, processor 110 performs actions indicated in steps 206, 208, and 210 for the second RLE_BURST instruction. Specifically, processor 110 replicates each bit of the RLE value indicated in the second RLE_BURST instruction. The number of times that processor 110 replicates each bit for this second instruction is indicated by the corresponding run length for the bit (i.e., from the register indicated by the second RLE_BURST instruction as containing the run length information). This replication of bits produces a plurality of replicated values, each of which corresponds to a corresponding bit of the RLE value. Processor 110 concatenates the replicated values, of the plurality of replicated values, in the same order as the bits of the RLE value to which the replicated values correspond, to produce a decompressed value. Subsequently, processor 110 stores the decompressed value as a result of the second RLE_BURST instruction (i.e., in the result register indicated in the second instruction).

At step 906, one or more instructions to concatenate the first and second decompressed values based, at least in part, on the determined length value are received. Continuing with the previous example, after executing the two RLE_BURST instructions and the RLE_LENGTH instruction described above, processor 110 receives one or more instructions to perform the following:

Shift the second decompressed value (i.e., resulting from the second RLE_BURST instruction) to the right by a value equal to the determined length of the first decompressed value (i.e., resulting from the first RLE_BURST instruction), to produce an adjusted decompressed value; and OR the first decompressed value with the adjusted decompressed value to produce a concatenated value.

The value resulting from the OR operation is the first decompressed value concatenated with the second decompressed value with no unused bits between the decompressed values. At step 908, in response to receiving the one or more instructions to concatenate the first and second decompressed values based, at least in part, on the determined length value, generating a concatenated value that includes both the first decompressed value and the second decompressed value without intervening unused bits.

After concatenating the two decompressed values to produce a composite value, the result may not fit in the destination register. As such, according to embodiments, some bits remain from the composite value to be concatenated with subsequent decompressed values. Also, the concatenation of the first and second decompressed values may still include unused bits when merged into a single register (i.e., when the combined lengths of the first and second decompressed values is less than 64). Combinations of ALU operations such as OR, shift, add, and subtract can be used to concatenate long streams of uncompressed data. The RLE_LENGTH instruction eliminates the need for an ALU to sum eight run-lengths per RLE_BURST instruction.

Hardware Overview

According to one embodiment, the techniques described herein are implemented by one or more special-purpose computing devices, such as computing device 100. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Example Distributed Computing Unit

Figure 10:
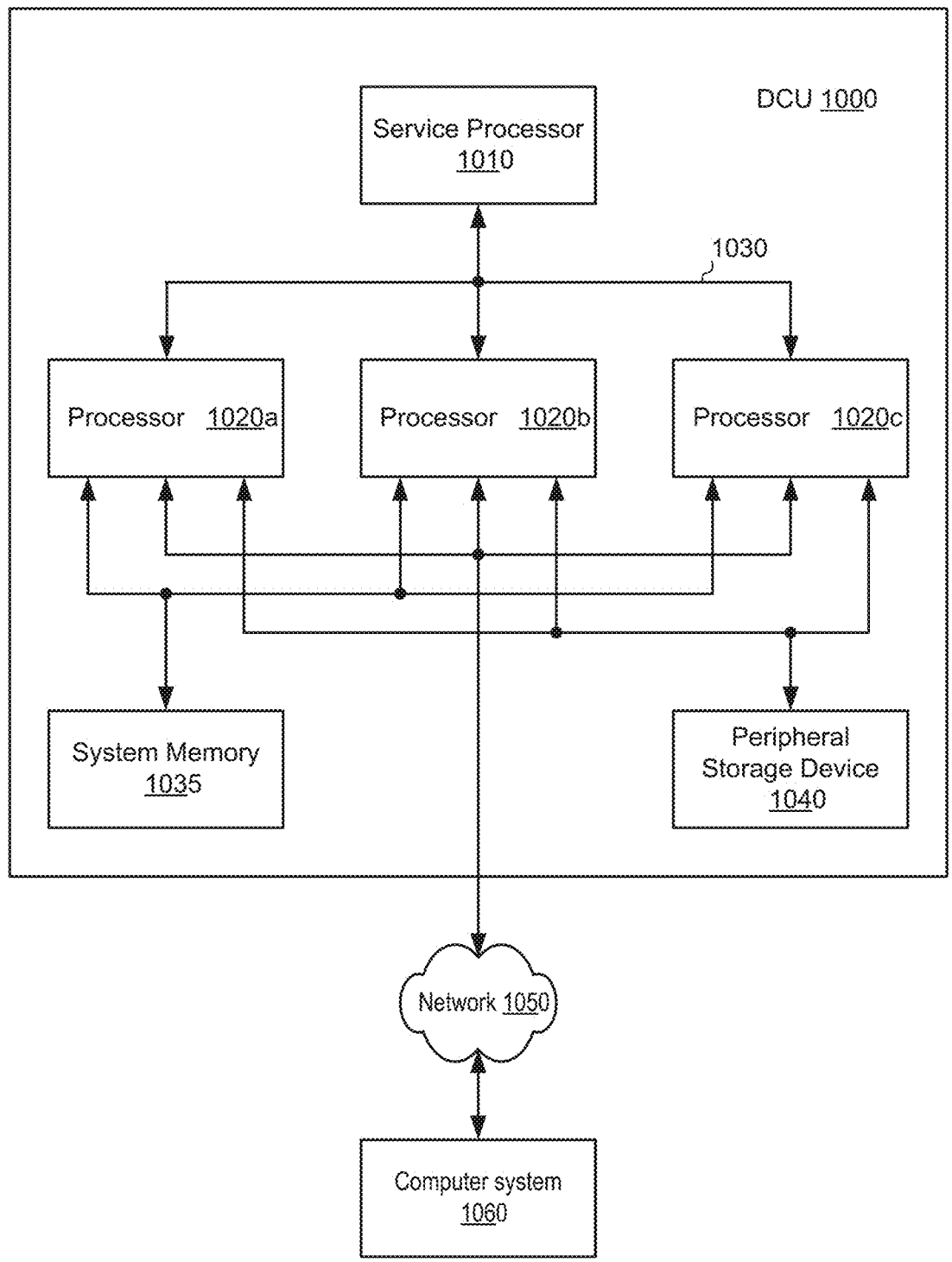
FIG. 10 depicts a block diagram of an embodiment of a distributed computing unit.

A block diagram illustrating one embodiment of a distributed computing unit (DCU) 1000 is shown in FIG. 10. In the illustrated embodiment, DCU 1000 includes a service processor 1010, coupled to a plurality of processors 1020*a-c* through scalable system interface (SSI) 1030. Processors 1020*a-c* are in turn coupled to system memory 1035, and peripheral storage device 1040. DCU 1000 is coupled to a network 1050, which is, in turn coupled to a computer system 1060. In various embodiments, DCU 1000 may be configured as a rack-mountable server system, a standalone system, or in any suitable form factor. In some embodiments, DCU 1000 may be configured as a client system rather than a server system.

System memory 1035 may include any suitable type of memory, such as Fully Buffered Dual Inline Memory Module (FB-DIMM), Double Data Rate or Double Data Rate 2 Synchronous Dynamic Random Access Memory (DDR/DDR2 SDRAM), or Rambus® DRAM (RDRAM®), for example. It is noted that although one system memory is shown, in various embodiments, any suitable number of system memories may be employed.

Peripheral storage device 1040 may, in some embodiments, include magnetic, optical, or solid-state storage media such as hard drives, optical disks, non-volatile random-access memory devices, etc. In other embodiments, peripheral storage device 1040 may include more complex storage devices such as disk arrays or storage area networks (SANs), which may be coupled to processors 1020*a-c* via a standard Small Computer System Interface (SCSI), a Fibre Channel interface, a Firewire® (IEEE 1394) interface, or another suitable interface. Additionally, it is contemplated that in other embodiments, any other suitable peripheral devices may be coupled to processors 1020*a-c*, such as multi-media devices, graphics/display devices, standard input/output devices, etc.

In one embodiment, service processor 1010 may include a field programmable gate array (FPGA) or an application specific integrated circuit (ASIC) configured to coordinate initialization and boot of processors 1020*a-c*, such as from a power-on reset state. Additionally, in some embodiments, service processor 1010 may include a programmable read-only memory (PROM) that may store instructions to perform a power-on self-test (POST). In various embodiments, service processor 1010 may be configured to allow access to administrative functions such as test and debug modes of processors 1020*a-c*, such as testing cache memories in processors 1020*a-c*, or providing test code to processors 1020*a-c* such that each of processors 1020*a-c* may test their respective cache memories, for example.

As described in greater detail below, each of processors 1020*a-c* may include one or more processor cores and cache memories. In some embodiments, each of processors 1020*a-c* may be coupled to a corresponding system memory, while in other embodiments, processors 1020*a-c* may share a common system memory. Processors 1020*a-c* may be configured to work concurrently on a single computing task and may communicate with each other through SSI bus 1030 to coordinate processing on that task. For example, a computing task may be divided into three parts and each part may be assigned to one of processors 1020*a-c*. Alternatively, processors 1020*a-c* may be configured to concurrently perform independent tasks that require little or no coordination among processors 1020*a-c*.

The embodiment of the distributed computing system illustrated in FIG. 10 is one of several examples. In other embodiments, different numbers and configurations of components are possible and contemplated.

Processor Overview

Figure 11:
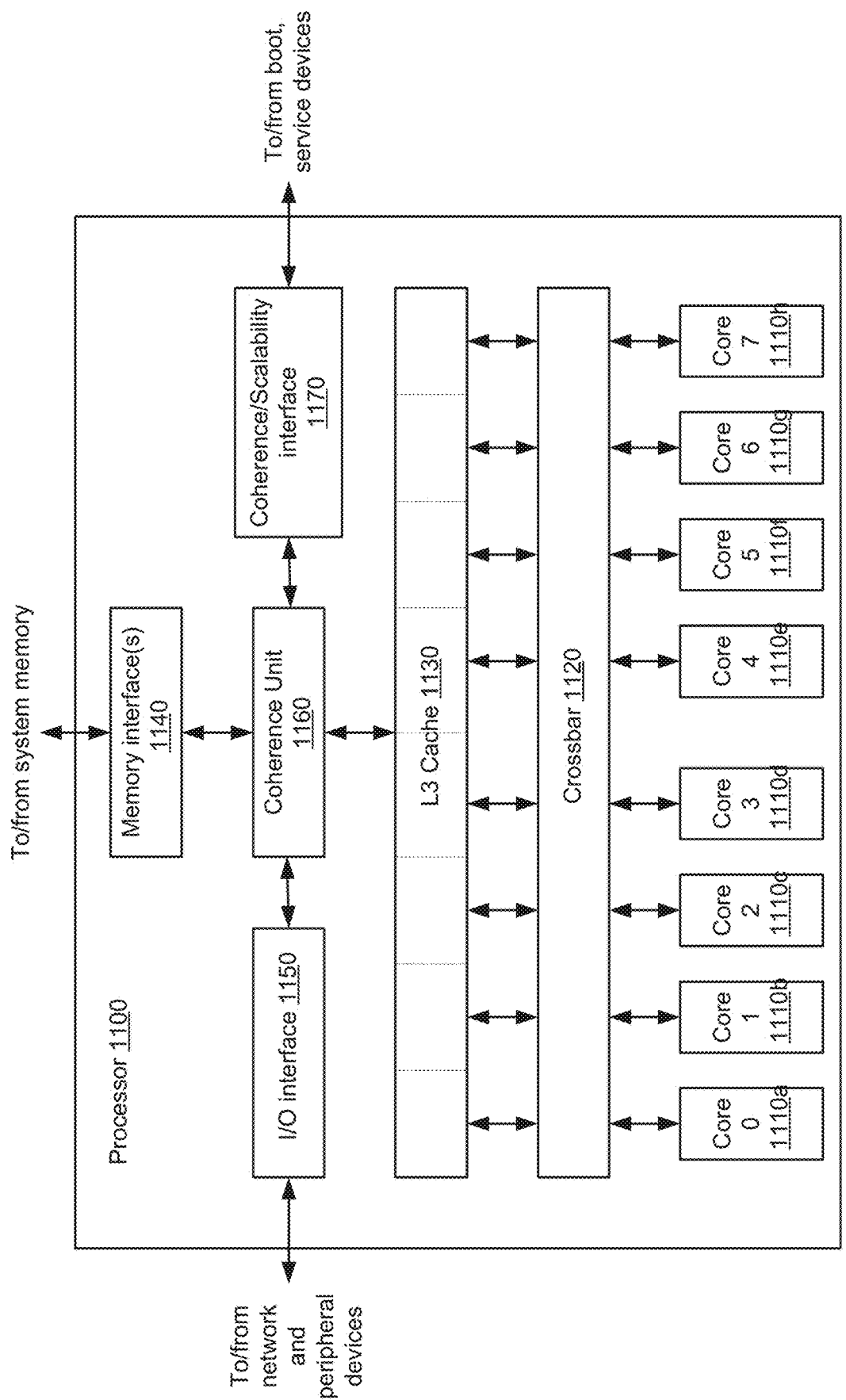
FIG. 11 depicts a block diagram of an embodiment of a processor.

A block diagram illustrating one embodiment of a multithreaded processor 1100 is shown in FIG. 11. In some embodiments, processor 1100 may correspond to processors 1020*a-c* of DCU 1000 in FIG. 10. In the illustrated embodiment, processor 1100 includes a plurality of processor cores 1110*a-h*, which are also designated "core 0" though "core 7." It is noted that although 8 cores are shown, in various embodiments, any suitable number of processor cores may be employed. Each of cores 1110 is coupled to an L3 cache 1130 via a crossbar 1120. L3 cache 1130 is coupled to coherence unit 1160, which is in turn coupled to input/output (I/O) interface 1150, coherence/scalability interface 1170. Additionally, coherence unit 1160 is coupled to one or more memory interface(s) 1140, which are coupled in turn to one or more banks of system memory (not shown). As described in greater detail below, I/O interface 1150 may couple processor 1100 to peripheral devices, and a network. Coherence/scalability interface 1170 may couple processor 1100 to boot and/or service devices such as, e.g., service processor 1010 in DCU 100. In some embodiments, the elements included in processor 1100 may be fabricated as part of a single integrated circuit (IC), for example on a single semiconductor die.

Cores 1110 may be configured to execute instructions and to process data according to a particular instruction set architecture (ISA). In one embodiment, cores 1110 may be configured to implement the SPARC® V9 ISA, although in other embodiments it is contemplated that any desired ISA may be employed, such as x86, PowerPC® or MIPS®, for example. In the illustrated embodiment, each of cores 1110 may be configured to operate independently of the others, such that all cores 1110 may execute in parallel. Additionally, in some embodiments each of cores 1110 may be configured to execute multiple threads concurrently, where a given thread may include a set of instructions that may execute independently of instructions from another thread. (For example, an individual software process, such as an application, may consist of one or more threads that may be scheduled for execution by an operating system.) Such a core 1110 may also be referred to as a multithreaded (MT) core. In one embodiment, each of cores 1110 may be configured to concurrently execute instructions from eight threads, for a total of 64 threads concurrently executing across processor 1100. However, in other embodiments it is contemplated that other numbers of cores 1110 may be provided, and that cores 1110 may concurrently process different numbers of threads.

Crossbar 1120 may be configured to manage data flow between cores 1110 and the shared L3 cache 1130. In one embodiment, crossbar 1120 may include logic (such as multiplexers or a switch fabric, for example) that allows any core 1110 to access any bank of L3 cache 1130, and that conversely allows data to be returned from any L3 bank to any core 1110. Crossbar 1120 may be configured to concurrently process data requests from cores 1110 to L3 cache 1130 as well as data responses from L3 cache 1130 to cores 1110. In some embodiments, crossbar 1120 may include logic to queue data requests and/or responses, such that requests and responses may not block other activity while waiting for service. Additionally, in one embodiment crossbar 1120 may be configured to arbitrate conflicts that may occur when multiple cores 1110 attempt to access a single bank of L3 cache 1130.

L3 cache 1130 may be configured to cache instructions and data for use by cores 1110. In the illustrated embodiment, L3 cache 1130 may be organized into eight separately addressable banks that may each be independently accessed, such that in the absence of conflicts, each bank may concurrently return data to a respective core 1110. In some embodiments, each individual bank may be implemented using set-associative or direct-mapped techniques. For example, in one embodiment, L3 cache 1130 may be a 48 megabyte (MB) cache, where each bank is 16-way set associative with a 64-byte line size, although other cache sizes and geometries are possible and contemplated. L3 cache 1130 may be implemented in some embodiments as a writeback cache in which written (dirty) data may not be written to system memory until a corresponding cache line is evicted.

In some embodiments, L3 cache 1130 may be configured to operate in a diagnostic mode that allows direct access to the cache memory. For example, in such a mode, L3 cache 1130 may permit the explicit addressing of specific cache structures such as individual sets, banks, ways, etc., in contrast to a conventional mode of cache operation in which some aspects of the cache may not be directly selectable (such as, e.g., individual cache ways). The diagnostic mode may be implemented as a direct port to L3 cache 1130 that may be used by, for example, service processor 1010 to store data into L3 cache 1130. Alternatively, crossbar 1120 may be configured to allow direct access to L3 cache 1130 by processor cores 1110 or through I/O interface 1150.

L3 cache 1130 may be further configured to implement a built-in self-test (BIST). An address generator, a test pattern generator, and a BIST controller may be included in L3 cache 1130. The address generator, test pattern generator, and BIST controller may be implemented in hardware, software, or a combination thereof. The BIST may perform tests such as, e.g., checkerboard, walking 1/0, sliding diagonal, and the like, to determine that data storage cells within L3 cache 1130 are capable of storing both a logical 0 and logical 1. In the case where the BIST determines that not all data storage cells within L3 cache 1130 are functional, a flag or other signal may be sent to service processor 1010 or one or more of processor cores 1110 indicating that L3 cache 1130 is faulty.

In some embodiments, L3 cache 1130 may implement queues for requests arriving from and results to be sent to crossbar 1120. Additionally, in some embodiments L3 cache 1130 may implement a fill buffer configured to store fill data arriving from memory interface 1140, a writeback buffer configured to store dirty evicted data to be written to memory, and/or a miss buffer configured to store L3 cache accesses that cannot be processed as simple cache hits (e.g., L3 cache misses, cache accesses matching older misses, accesses such as atomic operations that may require multiple cache accesses, etc.). L3 cache 1130 may variously be implemented as single-ported or multiported (i.e., capable of processing multiple concurrent read and/or write accesses). In either case, L3 cache 1130 may implement arbitration logic to prioritize cache access among various cache read and write requestors.

Memory interface 1140 may be configured to manage the transfer of data between L3 cache 1130 and system memory, for example, in response to L3 fill requests and data evictions. In some embodiments, multiple instances of memory interface 1140 may be implemented, with each instance configured to control a respective bank of system memory. Memory interface 1140 may be configured to interface to any suitable type of system memory, such as described above in reference to FIG. 10. In some embodiments, memory interface 1140 may be configured to support interfacing to multiple different types of system memory.

In the illustrated embodiment, processor 1100 may also be configured to receive data from sources other than system memory. I/O interface 1150 may be configured to provide a central interface for such sources to exchange data with cores 1110 and/or L3 cache 1130 via coherence unit 1160. In some embodiments, I/O interface 1150 may be configured to coordinate Direct Memory Access (DMA) transfers of data between external peripherals and system memory via coherence unit 1160 and memory interface 1140. In addition to coordinating access between crossbar 1120 and other interface logic, in one embodiment I/O interface 1150 may be configured to couple processor 1100 to external boot and/or service devices. For example, initialization and startup of processor 1100 may be controlled by an external device (such as, e.g., a FPGA) that may be configured to provide an implementation- or system-specific sequence of boot instructions and data. Such a boot sequence may, for example, coordinate reset testing, initialization of peripheral devices and initial execution of processor 1100, before the boot process proceeds to load data from a disk or network device. Additionally, in some embodiments such an external device may be configured to place processor 1100 in a debug, diagnostic, or other type of service mode upon request.

I/O interface 1150 may be configured to coordinate data transfer between processor 1100 and one or more peripheral devices. Such peripheral devices may include, without limitation, storage devices (e.g., magnetic or optical media-based storage devices including hard drives, tape drives, CD drives, DVD drives, etc.), display devices (e.g., graphics subsystems), multimedia devices (e.g., audio processing subsystems), or any other suitable type of peripheral device. In one embodiment, I/O interface 1150 may implement one or more instances of an interface such as Peripheral Component Interface Express (PCI Express™), although it is contemplated that any suitable interface standard or combination of standards may be employed. For example, in some embodiments I/O interface 1150 may be configured to implement a version of Universal Serial Bus (USB) protocol or IEEE 1394 (Firewire®) protocol in addition to or instead of PCI Express™.

I/O interface 1150 may also be configured to coordinate data transfer between processor 1100 and one or more devices (e.g., other computer systems) coupled to processor 1100 via a network. In one embodiment, I/O interface 1150 may be configured to perform the data processing in order to implement an Ethernet (IEEE 802.3) networking standard such as Gigabit Ethernet or 10-Gigabit Ethernet, for example, although it is contemplated that any suitable networking standard may be implemented. In some embodiments, I/O interface 1150 may be configured to implement multiple discrete network interface ports.

Core Overview

Figure 12:
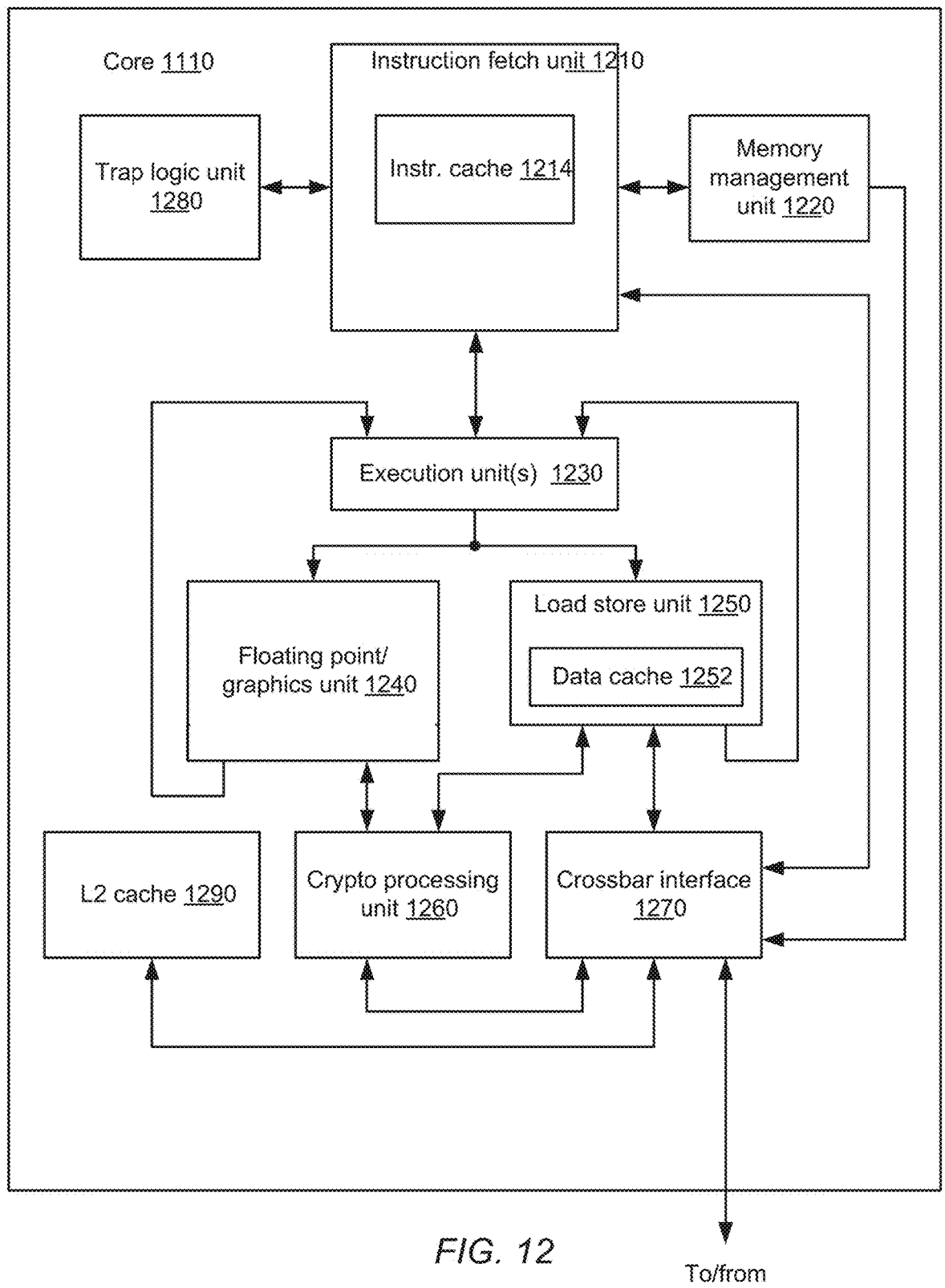
FIG. 12 depicts a block diagram of an embodiment of a processor core.

A possible embodiment of core 1110 configured is illustrated in FIG. 12. In the illustrated embodiment, core 1110 includes an instruction fetch unit (IFU) 1210 coupled to a memory management unit (MMU) 1220, a crossbar interface 1270, a trap logic unit (TLU) 1280, a L2 cache memory 1290, and a plurality of execution units 1230. Execution unit 1230 is coupled to both a floating point/graphics unit (FGU) 1240 and a load store unit (LSU) 350. Each of the latter units is also coupled to send data back to each of execution units 330. Both FGU 1240 and LSU 1250 are coupled to a crypto processing unit 1260. Additionally, LSU 1250, crypto processing unit 1260, L2 cache memory 1290 and MMU 1220 are coupled to crossbar interface 1270, which may in turn be coupled to crossbar 1120 shown in FIG. 11.

Instruction fetch unit 1210 may be configured to provide instructions to the rest of core 1110 for execution. In the illustrated embodiment, IFU 1210 may be configured to perform various operations relating to the fetching of instructions from cache or memory, the selection of instructions from various threads for execution, and the decoding of such instructions prior to issuing the instructions to various functional units for execution. Instruction fetch unit 1210 further includes an instruction cache 1214. In one embodiment, IFU 1210 may include logic to maintain fetch addresses (e.g., derived from program counters) corresponding to each thread being executed by core 1110, and to coordinate the retrieval of instructions from instruction cache 1214 according to those fetch addresses. Additionally, in some embodiments IFU 1210 may include logic to predict branch outcomes and/or fetch target addresses, such as a Branch History Table (BHT), Branch Target Buffer (BTB), or other suitable structure, for example.

In one embodiment, IFU 1210 may be configured to maintain a pool of fetched, ready-for-issue instructions drawn from among each of the threads being executed by core 1110. For example, IFU 1210 may implement a respective instruction buffer corresponding to each thread in which several recently-fetched instructions from the corresponding thread may be stored. In some embodiments, IFU 1210 may be configured to select multiple ready-to-issue instructions and concurrently issue the selected instructions to various functional units without constraining the threads from which the issued instructions are selected. In other embodiments, thread-based constraints may be employed to simplify the selection of instructions. For example, threads may be assigned to thread groups for which instruction selection is performed independently (e.g., by selecting a certain number of instructions per thread group without regard to other thread groups).

In some embodiments, IFU 1210 may be configured to further prepare instructions for execution, for example by decoding instructions, detecting scheduling hazards, arbitrating for access to contended resources, or the like. Moreover, in some embodiments, instructions from a given thread may be speculatively issued from IFU 1210 for execution. For example, a given instruction from a certain thread may fall in the shadow of a conditional branch instruction from that same thread that was predicted to be taken or not-taken, or a load instruction from that same thread that was predicted to hit in data cache 1252, but for which the actual outcome has not yet been determined. In such embodiments, after receiving notice of a misspeculation such as a branch misprediction or a load miss, IFU 1210 may be configured to cancel misspeculated instructions from a given thread as well as issued instructions from the given thread that are dependent on or subsequent to the misspeculated instruction, and to redirect instruction fetch appropriately.

Execution unit 1230 may be configured to execute and provide results for certain types of instructions issued from IFU 1210. In one embodiment, execution unit 1230 may be configured to execute certain integer-type instructions defined in the implemented ISA, such as arithmetic, logical, and shift instructions. It is contemplated that in some embodiments, core 1110 may include more than one execution unit 1230, and each of the execution units may or may not be symmetric in functionality. Finally, in the illustrated embodiment instructions destined for FGU 1240 or LSU 1250 pass through execution unit 1230. However, in alternative embodiments it is contemplated that such instructions may be issued directly from IFU 1210 to their respective units without passing through execution unit 1230.

Floating point/graphics unit 1240 may be configured to execute and provide results for certain floating-point and graphics-oriented instructions defined in the implemented ISA. For example, in one embodiment FGU 1240 may implement single- and double-precision floating-point arithmetic instructions compliant with a version of the Institute of Electrical and Electronics Engineers (IEEE) 754 Standard for Binary Floating-Point Arithmetic (more simply referred to as the IEEE 754 standard), such as add, subtract, multiply, divide, and certain transcendental functions. Also, in one embodiment FGU 1240 may implement partitioned-arithmetic and graphics-oriented instructions defined by a version of the SPARC® Visual Instruction Set (VIS™) architecture, such as VIS™ 2.0. Additionally, in one embodiment FGU 1240 may implement certain integer instructions such as integer multiply, divide, and population count instructions. Depending on the implementation of FGU 1240, some instructions (e.g., some transcendental or extended-precision instructions) or instruction operand or result scenarios (e.g., certain denormal operands or expected results) may be trapped and handled or emulated by software.

In the illustrated embodiment, FGU 1240 may be configured to store floating-point register state information for each thread in a floating-point register file. In one embodiment, FGU 1240 may implement separate execution pipelines for floating point add/multiply, divide/square root, and graphics operations, while in other embodiments the instructions implemented by FGU 1240 may be differently partitioned. In various embodiments, instructions implemented by FGU 1240 may be fully pipelined (i.e., FGU 1240 may be capable of starting one new instruction per execution cycle), partially pipelined, or may block issue until complete, depending on the instruction type. For example, in one embodiment floating-point add operations may be fully pipelined, while floating-point divide operations may block other divide/square root operations until completed.

Load store unit 1250 may be configured to process data memory references, such as integer and floating-point load and store instructions. In some embodiments, LSU 1250 may also be configured to assist in the processing of instruction cache 1214 misses originating from IFU 1210. LSU 1250 may include a data cache 1252 as well as logic configured to detect cache misses and to responsively request data from L3 cache 1130 via crossbar interface 1270. In one embodiment, data cache 1252 may be configured as a write-through cache in which all stores are written to L3 cache 1130 regardless of whether they hit in data cache 1252; in some such embodiments, stores that miss in data cache 1252 may cause an entry corresponding to the store data to be allocated within the cache. In other embodiments, data cache 1252 may be implemented as a write-back cache.

In one embodiment, LSU 1250 may include a miss queue configured to store records of pending memory accesses that have missed in data cache 1252 such that additional memory accesses targeting memory addresses for which a miss is pending may not generate additional L3 cache request traffic. In the illustrated embodiment, address generation for a load/store instruction may be performed by one of EXUs 1230. Depending on the addressing mode specified by the instruction, one of EXUs 1230 may perform arithmetic (such as adding an index value to a base value, for example) to yield the desired address. Additionally, in some embodiments LSU 1250 may include logic configured to translate virtual data addresses generated by EXUs 1230 to physical addresses, such as a Data Translation Lookaside Buffer (DTLB).

Crypto processing unit 1260 may be configured to implement one or more specific data processing algorithms in hardware. For example, crypto processing unit 1260 may include logic configured to support encryption/decryption algorithms such as Advanced Encryption Standard (AES), Data Encryption Standard/Triple Data Encryption Standard (DES/3DES), or Ron's Code #4 (RC4). Crypto processing unit 1260 may also include logic to implement hash or checksum algorithms such as Secure Hash Algorithm (SHA-1, SHA-256), Message Digest 5 (MD5), or Cyclic Redundancy Checksum (CRC). Crypto processing unit 1260 may also be configured to implement modular arithmetic such as modular multiplication, reduction and exponentiation. In one embodiment, crypto processing unit 1260 may be configured to utilize the multiply array included in FGU 1240 for modular multiplication. In various embodiments, crypto processing unit 1260 may implement several of the aforementioned algorithms as well as other algorithms not specifically described.

Crypto processing unit 1260 may be configured to execute as a coprocessor independent of integer or floating-point instruction issue or execution. For example, in one embodiment crypto processing unit 1260 may be configured to receive operations and operands via control registers accessible via software; in the illustrated embodiment crypto processing unit 1260 may access such control registers via LSU 1250. In such embodiments, crypto processing unit 1260 may be indirectly programmed or configured by instructions issued from IFU 1210, such as instructions to read or write control registers. However, even if indirectly programmed by such instructions, crypto processing unit 1260 may execute independently without further interlock or coordination with IFU 1210. In another embodiment crypto processing unit 1260 may receive operations (e.g., instructions) and operands decoded and issued from the instruction stream by IFU 1210, and may execute in response to such operations. That is, in such an embodiment crypto processing unit 1260 may be configured as an additional functional unit schedulable from the instruction stream, rather than as an independent coprocessor.

In some embodiments, crypto processing unit 1260 may be configured to freely schedule operations across its various algorithmic subunits independent of other functional unit activity. Additionally, crypto processing unit 1260 may be configured to generate memory load and store activity, for example to system memory. In the illustrated embodiment, crypto processing unit 1260 may interact directly with crossbar interface 1270 for such memory activity, while in other embodiments crypto processing unit 1260 may coordinate memory activity through LSU 1250. In one embodiment, software may poll crypto processing unit 1260 through one or more control registers to determine result status and to retrieve ready results, for example by accessing additional control registers. In other embodiments, FGU 1240, LSU 1250 or other logic may be configured to poll crypto processing unit 1260 at intervals to determine whether it has results that are ready to write back. In still other embodiments, crypto processing unit 1260 may be configured to generate a trap when a result is ready, to allow software to coordinate result retrieval and processing.

L2 cache memory 1290 may be configured to cache instructions and data for use by execution unit 1230. In the illustrated embodiment, L2 cache memory 1290 may be organized into multiple separately addressable banks that may each be independently accessed. In some embodiments, each individual bank may be implemented using set-associative or direct-mapped techniques.

L2 cache memory 1290 may be implemented in some embodiments as a writeback cache in which written (dirty) data may not be written to system memory until a corresponding cache line is evicted. L2 cache memory 1290 may variously be implemented as single-ported or multiported (i.e., capable of processing multiple concurrent read and/or write accesses). In either case, L2 cache memory 1290 may implement arbitration logic to prioritize cache access among various cache read and write requestors.

In some embodiments, L2 cache memory 1290 may be configured to operate in a diagnostic mode that allows direct access to the cache memory. For example, in such a mode, L2 cache memory 1290 may permit the explicit addressing of specific cache structures such as individual sets, banks, ways, etc., in contrast to a conventional mode of cache operation in which some aspects of the cache may not be directly selectable (such as, e.g., individual cache ways). The diagnostic mode may be implemented as a direct port to L2 cache memory 1290. Alternatively, crossbar interface 1270 or MMU 1220 may be configured to allow direct access to L2 cache memory 1290 via the crossbar interface.

L2 cache memory 1290 may be further configured to implement a BIST. An address generator, a test pattern generator, and a BIST controller may be included in L2 cache memory 1290. The address generator, test pattern generator, and BIST controller may be implemented in hardware, software, or a combination thereof. The BIST may perform tests such as, e.g., checkerboard, walking 1/0, sliding diagonal, and the like, to determine that data storage cells within L2 cache memory 1290 are capable of storing both a logical 0 and logical 1. In the case where the BIST determines that not all data storage cells within L2 cache memory 1290 are functional, a flag or other signal may be activated indicating that L2 cache memory 1290 is faulty.

As previously described, instruction and data memory accesses may involve translating virtual addresses to physical addresses. In one embodiment, such translation may occur on a page level of granularity, where a certain number of address bits comprise an offset into a given page of addresses, and the remaining address bits comprise a page number. For example, in an embodiment employing 4 MB pages, a 64 bit virtual address and a 40-bit physical address, 22 address bits (corresponding to 4 MB of address space, and typically the least significant address bits) may constitute the page offset. The remaining 42 bits of the virtual address may correspond to the virtual page number of that address, and the remaining 18 bits of the physical address may correspond to the physical page number of that address. In such an embodiment, virtual to physical address translation may occur by mapping a virtual page number to a particular physical page number, leaving the page offset unmodified.

Such translation mappings may be stored in an ITLB or a DTLB for rapid translation of virtual addresses during lookup of instruction cache 1214 or data cache 1252. In the event no translation for a given virtual page number is found in the appropriate TLB, memory management unit 1220 may be configured to provide a translation. In one embodiment, MMU 1220 may be configured to manage one or more translation tables stored in system memory and to traverse such tables (which in some embodiments may be hierarchically organized) in response to a request for an address translation, such as from an ITLB or DTLB miss. (Such a traversal may also be referred to as a page table walk.) In some embodiments, if MMU 1220 is unable to derive a valid address translation, for example if one of the memory pages including a page table is not resident in physical memory (i.e., a page miss), MMU 1220 may be configured to generate a trap to allow a memory management software routine to handle the translation. It is contemplated that in various embodiments, any desirable page size may be employed. Further, in some embodiments multiple page sizes may be concurrently supported.

A number of functional units in the illustrated embodiment of core 1110 may be configured to generate off-core memory or I/O requests. For example, IFU 1210 or LSU 1250 may generate access requests to L3 cache 1130 in response to their respective cache misses. Crypto processing unit 1260 may be configured to generate its own load and store requests independent of LSU 1250, and MMU 1220 may be configured to generate memory requests while executing a page table walk. Other types of off-core access requests are possible and contemplated. In the illustrated embodiment, crossbar interface 1270 may be configured to provide a centralized interface to the port of crossbar 1120 associated with a particular core 1110, on behalf of the various functional units that may generate accesses that traverse crossbar 1120. In one embodiment, crossbar interface 1270 may be configured to maintain queues of pending crossbar requests and to arbitrate among pending requests to determine which request or requests may be conveyed to crossbar 1120 during a given execution cycle. For example, crossbar interface 1270 may implement a least-recently-used or other algorithm to arbitrate among crossbar requestors. In one embodiment, crossbar interface 1270 may also be configured to receive data returned via crossbar 1120, such as from L3 cache 1130 or I/O interface 1150, and to direct such data to the appropriate functional unit (e.g., data cache 1252 for a data cache fill due to miss). In other embodiments, data returning from crossbar 1120 may be processed externally to crossbar interface 1270.

During the course of operation of some embodiments of core 1110, exceptional events may occur. For example, an instruction from a given thread that is picked for execution by pick unit 1216 may be not be a valid instruction for the ISA implemented by core 1110 (e.g., the instruction may have an illegal opcode), a floating-point instruction may produce a result that requires further processing in software, MMU 1220 may not be able to complete a page table walk due to a page miss, a hardware error (such as uncorrectable data corruption in a cache or register file) may be detected, or any of numerous other possible architecturally-defined or implementation-specific exceptional events may occur. In one embodiment, trap logic unit 1280 may be configured to manage the handling of such events. For example, TLU 1280 may be configured to receive notification of an exceptional event occurring during execution of a particular thread, and to cause execution control of that thread to vector to a supervisor-mode software handler (i.e., a trap handler) corresponding to the detected event. Such handlers may include, for example, an illegal opcode trap handler configured to return an error status indication to an application associated with the trapping thread and possibly terminate the application, a floating-point trap handler configured to fix up an inexact result, etc.

In one embodiment, TLU 1280 may be configured to flush all instructions from the trapping thread from any stage of processing within core 1110, without disrupting the execution of other, non-trapping threads. In some embodiments, when a specific instruction from a given thread causes a trap (as opposed to a trap-causing condition independent of instruction execution, such as a hardware interrupt request), TLU 1280 may implement such traps as precise traps. That is, TLU 1280 may ensure that all instructions from the given thread that occur before the trapping instruction (in program order) complete and update architectural state, while no instructions from the given thread that occur after the trapping instruction (in program order) complete or update architectural state.

Computing System

Figure 13:
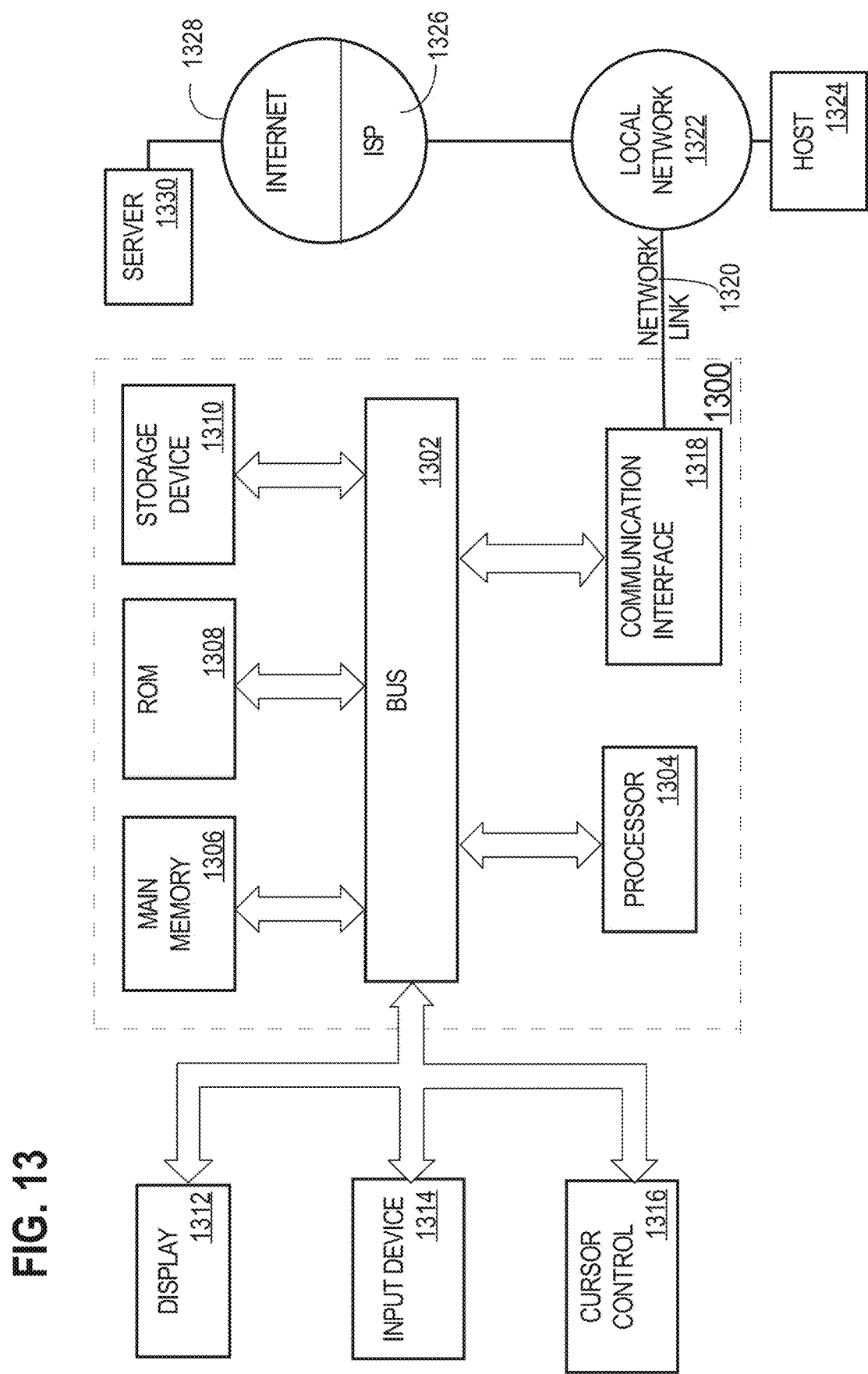
FIG. 13 depicts a block diagram of a computer system on which embodiments may be implemented.

As a further example, FIG. 13 is a block diagram that illustrates a computer system 1300 upon which an embodiment of the invention may be implemented. Computer system 1300 includes a bus 1302 or other communication mechanism for communicating information, and a hardware processor 1304 coupled with bus 1302 for processing information. Hardware processor 1304 may be, for example, a general purpose microprocessor.

Computer system 1300 also includes a main memory 1306, such as a random access memory (RAM) or other dynamic storage device, coupled to bus 1302 for storing information and instructions to be executed by processor 1304. Main memory 1306 also may be used for storing temporary variables or other intermediate information during execution of instructions to be executed by processor 1304. Such instructions, when stored in non-transitory storage media accessible to processor 1304, render computer system 1300 into a special-purpose machine that is customized to perform the operations specified in the instructions.

Computer system 1300 further includes a read only memory (ROM) 1308 or other static storage device coupled to bus 1302 for storing static information and instructions for processor 1304. A storage device 1310, such as a magnetic disk, optical disk, or solid-state drive is provided and coupled to bus 1302 for storing information and instructions.

Computer system 1300 may be coupled via bus 1302 to a display 1312, such as a cathode ray tube (CRT), for displaying information to a computer user. An input device 1314, including alphanumeric and other keys, is coupled to bus 1302 for communicating information and command selections to processor 1304. Another type of user input device is cursor control 1316, such as a mouse, a trackball, or cursor direction keys for communicating direction information and command selections to processor 1304 and for controlling cursor movement on display 1312. This input device typically has two degrees of freedom in two axes, a first axis (e.g., x) and a second axis (e.g., y), that allows the device to specify positions in a plane.

Computer system 1300 may implement the techniques described herein using customized hard-wired logic, one or more ASICs or FPGAs, firmware and/or program logic which in combination with the computer system causes or programs computer system 1300 to be a special-purpose machine. According to one embodiment, the techniques herein are performed by computer system 1300 in response to processor 1304 executing one or more sequences of one or more instructions contained in main memory 1306. Such instructions may be read into main memory 1306 from another storage medium, such as storage device 1310. Execution of the sequences of instructions contained in main memory 1306 causes processor 1304 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 1310. Volatile media includes dynamic memory, such as main memory 1306. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 1302. Transmission media can also take the form of acoustic or light waves, such as those generated during radio-wave and infra-red data communications.

Various forms of media may be involved in carrying one or more sequences of one or more instructions to processor 1304 for execution. For example, the instructions may initially be carried on a magnetic disk or solid-state drive of a remote computer. The remote computer can load the instructions into its dynamic memory and send the instructions over a telephone line using a modem. A modem local to computer system 1300 can receive the data on the telephone line and use an infra-red transmitter to convert the data to an infra-red signal. An infra-red detector can receive the data carried in the infra-red signal and appropriate circuitry can place the data on bus 1302. Bus 1302 carries the data to main memory 1306, from which processor 1304 retrieves and executes the instructions. The instructions received by main memory 1306 may optionally be stored on storage device 1310 either before or after execution by processor 1304.

Computer system 1300 also includes a communication interface 1318 coupled to bus 1302. Communication interface 1318 provides a two-way data communication coupling to a network link 1320 that is connected to a local network 1322. For example, communication interface 1318 may be an integrated services digital network (ISDN) card, cable modem, satellite modem, or a modem to provide a data communication connection to a corresponding type of telephone line. As another example, communication interface 1318 may be a local area network (LAN) card to provide a data communication connection to a compatible LAN. Wireless links may also be implemented. In any such implementation, communication interface 1318 sends and receives electrical, electromagnetic or optical signals that carry digital data streams representing various types of information.

Network link 1320 typically provides data communication through one or more networks to other data devices. For example, network link 1320 may provide a connection through local network 1322 to a host computer 1324 or to data equipment operated by an Internet Service Provider (ISP) 1326. ISP 1326 in turn provides data communication services through the world wide packet data communication network now commonly referred to as the "Internet" 1328. Local network 1322 and Internet 1328 both use electrical, electromagnetic or optical signals that carry digital data streams. The signals through the various networks and the signals on network link 1320 and through communication interface 1318, which carry the digital data to and from computer system 1300, are example forms of transmission media.

Computer system 1300 can send messages and receive data, including program code, through the network(s), network link 1320 and communication interface 1318. In the Internet example, a server 1330 might transmit a requested code for an application program through Internet 1328, ISP 1326, local network 1322 and communication interface 1318.

The received code may be executed by processor 1304 as it is received, and/or stored in storage device 1310, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A method comprising:
   receiving an instruction to decompress a run-length-encoded (RLE) value;
   wherein the RLE value comprises a plurality of bits;
   wherein each bit, of the RLE value, corresponds to a corresponding run length of a plurality of run lengths; and
   in response to receiving the instruction to decompress the RLE value, performing a set of actions during both of a first pipelined execution stage and a second pipelined execution stage;

wherein the first pipelined execution stage comprises:
  replicating each bit, of the RLE value, a number of times indicated by the corresponding run length that corresponds to the bit, to produce a respective decompressed sub-value of a plurality of decompressed sub-values that are based on the RLE value; and
  wherein at least one plurality of bits, from the RLE value, are replicated in parallel;
  concatenating the decompressed sub-values, of the plurality of decompressed sub-values, in parallel based on the order of the bits within the RLE value to which the decompressed sub-values correspond, to produce two or more decompressed intermediate values;
wherein the second pipelined execution stage comprises concatenating the two or more decompressed intermediate values to produce a decompressed value;
storing the decompressed value as a result for the instruction to decompress the RLE value;
wherein the method is performed by one or more computing devices.

2. The method of claim 1, wherein
all of the decompressed sub-values, of the plurality of decompressed sub-values, have the same number of bits, respectively;
the method further comprises:
  shifting zero or more bits out of one or more decompressed sub-values, of the plurality of decompressed sub-values, to produce one or more adjusted intermediate sub-values;
  wherein a number of bits shifted out of each of the one or more adjusted intermediate sub-values is based, at least in part, on the corresponding run length that corresponds to the bit, of the RLE value, that is represented in the decompressed sub-value.

3. The method of claim 2, wherein:
each of the plurality of run lengths is represented as a biased value;
the method further comprises:
  calculating a plurality of shift counts, one for each particular bit of the RLE value, based on the corresponding run length, of the plurality of run lengths, that corresponds to the particular bit, and
  wherein each shift count, of the plurality of shift counts, corresponds to the decompressed sub-value that also corresponds to the corresponding bit of the RLE value; and
  wherein each of the plurality of shift counts respectively represents a number of bits to be shifted out of the corresponding decompressed sub-value, of the plurality of decompressed sub-values.

4. The method of claim 3, wherein calculating a particular shift count, of the plurality of shift counts, comprises inverting the corresponding run length on which the particular shift count is based.

5. The method of claim 3, wherein the biased values, of the plurality of run lengths, are each represented by three bits.

6. The method of claim 3, further comprising:
respectively concatenating at least two adjusted intermediate sub-values with two or more decompressed sub-values, of the plurality of decompressed sub-values, to produce two or more composite replicated sub-values;
calculating a respective composite shift count, for each of the two or more composite replicated sub-values, based on the shift count for the respective decompressed sub-value included in the composite replicated sub-value;
shifting zero or more bits, from each of the two or more composite replicated sub-values, based on the shift count calculated for the respective composite replicated sub-value;
wherein said calculating the composite shift count is performed in parallel with said shifting the zero or more bits out of the two or more composite replicated sub-values.

7. The method of claim 6, wherein concatenating the decompressed sub-values to produce the two or more decompressed intermediate values comprises:
concatenating the two or more composite replicated sub-values together to produce the two or more decompressed intermediate values.

8. The method of claim 2, wherein shifting zero or more bits out of one or more decompressed sub-values comprises shifting, in parallel, zero or more bits out of two or more decompressed sub-values of the plurality of decompressed sub-values.

9. The method of claim 1, wherein the set of actions is performed using hardware that is implemented in one of:
a block that is external to one or more processors of the one or more computing devices; or
one or more processors of the one or more computing devices.

10. The method of claim 1, wherein, in the decompressed value, the bits of the decompressed sub-values, of the plurality of decompressed sub-values, are concatenated without any intervening unused bits between the bits of the decompressed sub-values.

11. The method of claim 1, further comprising:
receiving an instruction to determine a length of the decompressed value;
in response to receiving the instruction to determine the length of the decompressed value:
  calculating a plurality of shift counts, one for each particular bit of the RLE value, based on the corresponding run length, of the plurality of run lengths, that corresponds to the particular bit,
  adding together the plurality of shift counts to produce a total shift count value, and
  performing a 2's complement on the total shift count value to produce a determined length value; and
returning, as a result for the instruction to determine the length of the decompressed value, the determined length value.

12. The method of claim 11, wherein:
the instruction to decompress the RLE value is a first instruction to decompress a first RLE value;
the decompressed value is a first decompressed value that is represented with a 64 bit-representation;
the determined length value indicates a length of less than 64 bits;
the 64 bit-representation includes one or more unused bits; and
the method further comprises:
  receiving a second instruction to decompress a second RLE value;
  in response to receiving the second instruction, performing the set of actions, based on information for the second RLE value, to produce a second decompressed value;

receiving one or more instructions to concatenate the first decompressed value and the second decompressed value based, at least in part, on the determined length value; and in response to receiving the one or more instructions to concatenate the first decompressed value and the second decompressed value based, at least in part, on the determined length value, generating a concatenated value that includes both the first decompressed value and the second decompressed value without intervening unused bits.

13. The method of claim 1, wherein each of the first pipelined execution stage and the second pipelined execution stage has a throughput of one cycle.

14. One or more non-transitory computer-readable media storing one or more sequences of instructions, which, when executed by one or more processors, cause:

receiving an instruction to decompress a run-length-encoded (RLE) value;

wherein the RLE value comprises a plurality of bits;

wherein each bit, of the RLE value, corresponds to a corresponding run length of a plurality of run lengths; and in response to receiving the instruction to decompress the RLE value, performing a set of actions during both of a first pipelined execution stage and a second pipelined execution stage;

wherein the first pipelined execution stage comprises:

replicating each bit, of the RLE value, a number of times indicated by the corresponding run length that corresponds to the bit, to produce a respective decompressed sub-value of a plurality of decompressed sub-values that are based on the RLE value; and wherein at least one plurality of bits, from the RLE value, are replicated in parallel;

concatenating the decompressed sub-values, of the plurality of decompressed sub-values, in parallel based on the order of the bits within the RLE value to which the decompressed sub-values correspond, to produce two or more decompressed intermediate values;

wherein the second pipelined execution stage comprises concatenating the two or more decompressed intermediate values to produce a decompressed value;

storing the decompressed value as a result for the instruction to decompress the RLE value.

15. The one or more non-transitory computer-readable media of claim 14, wherein:

all of the decompressed sub-values, of the plurality of decompressed sub-values, have the same number of bits, respectively;

the one or more sequences of instructions further comprise instructions which, when executed by one or more processors, cause:

shifting zero or more bits out of one or more decompressed sub-values, of the plurality of decompressed sub-values, to produce one or more adjusted intermediate sub-values;

wherein a number of bits shifted out of each of the one or more adjusted intermediate sub-values is based, at least in part, on the corresponding run length that corresponds to the bit, of the RLE value, that is represented in the decompressed sub-value.

16. The one or more non-transitory computer-readable media of claim 15, wherein:

each of the plurality of run lengths is represented as a biased value;

the one or more sequences of instructions further comprise instructions which, when executed by one or more processors, cause:

calculating a plurality of shift counts, one for each particular bit of the RLE value, based on the corresponding run length, of the plurality of run lengths, that corresponds to the particular bit, and wherein each shift count, of the plurality of shift counts, corresponds to the decompressed sub-value that also corresponds to the corresponding bit of the RLE value; and wherein each of the plurality of shift counts respectively represents a number of bits to be shifted out of the corresponding decompressed sub-value, of the plurality of decompressed sub-values.

17. The one or more non-transitory computer-readable media of claim 16, wherein calculating a particular shift count, of the plurality of shift counts, comprises inverting the corresponding run length on which the particular shift count is based.

18. The one or more non-transitory computer-readable media of claim 15, wherein shifting zero or more bits out of one or more decompressed sub-values comprises shifting, in parallel, zero or more bits out of two or more decompressed sub-values of the plurality of decompressed sub-values.

19. The one or more non-transitory computer-readable media of claim 14, wherein the set of actions is performed using hardware that is implemented in one of:

one or more processors of the one or more computing devices; or a block that is external to one or more processors of the one or more computing devices.

20. The one or more non-transitory computer-readable media of claim 14, wherein the one or more sequences of instructions further comprise instructions which, when executed by one or more processors, cause:

receiving an instruction to determine a length of the decompressed value;

in response to receiving the instruction to determine the length of the decompressed value:

calculating a plurality of shift counts, one for each particular bit of the RLE value, based on the corresponding run length, of the plurality of run lengths, that corresponds to the particular bit, adding together the plurality of shift counts to produce a total shift count value, and performing a 2's complement on the total shift count value to produce a determined length value; and returning, as a result for the instruction to determine the length of the decompressed value, the determined length value.

21. The one or more non-transitory computer-readable media of claim 20, wherein:

the instruction to decompress the RLE value is a first instruction to decompress a first RLE value;

the decompressed value is a first decompressed value that is represented with a 64 bit-representation;

the determined length value indicates a length of less than 64 bits;

the 64 bit-representation includes one or more unused bits; and the one or more sequences of instructions further comprise instructions which, when executed by one or more processors, cause:

receiving a second instruction to decompress a second RLE value;

in response to receiving the second instruction, performing the set of actions, based on information for the second RLE value, to produce a second decompressed value;

receiving one or more instructions to concatenate the first decompressed value and the second decompressed value based, at least in part, on the determined length value; and in response to receiving the one or more instructions to concatenate the first decompressed value and the second decompressed value based, at least in part, on the determined length value, generating a concatenated value that includes both the first decompressed value and the second decompressed value without intervening unused bits.

22. The one or more non-transitory computer-readable media of claim 14, wherein each of the first pipelined execution stage and the second pipelined execution stage has a throughput of one cycle.

23. A computing device comprising:

one or more processors;

one or more first hardware components configured to perform a first set of actions comprising a first pipelined execution stage for decompressing run-length encoded (RLE) values;

one or more second hardware components configured to perform a second set of actions comprising a second pipelined execution stage for decompressing RLE values; and one or more computer-readable media configured to store decompressed values based on RLE values;

wherein the first set of actions comprises:

replicating each bit, of an RLE value that comprises a plurality of bits, a number of times indicated by a corresponding run length that corresponds to the bit, to produce a respective decompressed sub-value of a plurality of decompressed sub-values that are based on the RLE value, and wherein at least one plurality of bits, from the RLE value, are replicated in parallel;

concatenating the decompressed sub-values, of the plurality of decompressed sub-values, in parallel based on the order of the bits within the RLE value to which the decompressed sub-values correspond, to produce two or more decompressed intermediate values;

wherein the second set of actions comprises:

concatenating the two or more decompressed intermediate values to produce a decompressed value; and storing the decompressed value in the one or more computer-readable media.

* * * * *

UNITED STATES PATENT AND TRADEMARK OFFICE
CERTIFICATE OF CORRECTION

PATENT NO. : 10,534,606 B2
APPLICATION NO. : 14/867929
DATED : January 14, 2020
INVENTOR(S) : Brooks et al.

Page 1 of 1

It is certified that error appears in the above-identified patent and that said Letters Patent is hereby corrected as shown below:

On the Title Page

On page 3, Column 2, under Other Publications, Line 19, delete "Tighly" and insert -- Tightly --, therefor.

On page 4, Column 2, under Other Publications, Line 41, delete "Suplemental" and insert -- Supplemental --, therefor.

In the Claims

In Column 27, Line 24, in Claim 2, delete "wherein" and insert -- wherein: --, therefor.

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*